United States Patent
Yasuhara

(10) Patent No.: US 10,490,276 B2
(45) Date of Patent: Nov. 26, 2019

(54) NON-VOLATILE STORAGE DEVICE AND DRIVING METHOD

(71) Applicant: PANASONIC CORPORATION, Osaka (JP)

(72) Inventor: Ryutaro Yasuhara, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/221,092

(22) Filed: Dec. 14, 2018

(65) Prior Publication Data
US 2019/0122731 A1 Apr. 25, 2019

Related U.S. Application Data

(63) Continuation of application No. PCT/JP2018/024077, filed on Jun. 26, 2018.

(30) Foreign Application Priority Data

Sep. 12, 2017 (JP) ................. 2017-174642

(51) Int. Cl.
*G11C 13/00* (2006.01)
*H01L 45/00* (2006.01)

(52) U.S. Cl.
CPC ...... *G11C 13/0069* (2013.01); *G11C 13/0007* (2013.01); *G11C 13/0061* (2013.01);
(Continued)

(58) Field of Classification Search
CPC ................................ G11C 13/0069
(Continued)

(56) References Cited

U.S. PATENT DOCUMENTS 6,204,139 B1 3/2001 Liu et al.
2004/0245557 A1 12/2004 Seo et al.
(Continued)

FOREIGN PATENT DOCUMENTS

| JP | 2004-363604 A | 12/2004 |
|----|---------------|---------|
| JP | 2010-211883 A | 9/2010 |
| WO | 2010/116754 A1 | 10/2010 |

OTHER PUBLICATIONS

"Development of Super Long-term Memory and Systems", CRDS-FY2012-WR-07, Workshop on future strategy for science and technology held on Nov. 16, 2012, Center for Research and Development Strategy, Japan Science and Technology Agency, pp. 1-67 with partial English translation.

International Search Report and Written Opinion dated Jul. 31, 2018 in International (PCT) Application No. PCT/JP2018/024077.

*Primary Examiner* — Jason Lappas
(74) *Attorney, Agent, or Firm* — McDermott Will & Emery LLP

(57) ABSTRACT

A non-volatile storage device includes: a first electrode; a second electrode; a variable resistance element including a variable resistance layer having a resistance value which changes according to a voltage pulse applied between the first and second electrodes; a voltage pulse application circuit which applies the voltage pulse between the first and second electrodes; and a control circuit which controls the voltage pulse application circuit. Upon receiving an external instruction, the control circuit: reads a current resistance state of the variable resistance element; and when the current resistance state is the high resistance state, causes the voltage pulse application circuit to apply a first additional voltage pulse having a first polarity between the electrodes; and when the current resistance state is the low resistance state, causes the voltage pulse application circuit to apply, (Continued)

between the electrodes, a second additional voltage pulse having a second polarity different from the first polarity.

17 Claims, 8 Drawing Sheets

(52) U.S. Cl.
CPC .......... *G11C 13/0064* (2013.01); *H01L 45/04* (2013.01); *H01L 45/08* (2013.01); *H01L 45/1233* (2013.01); *H01L 45/146* (2013.01); *G11C 2013/0071* (2013.01); *G11C 2013/0073* (2013.01); *G11C 2013/0078* (2013.01); *G11C 2013/0092* (2013.01); *G11C 2213/31* (2013.01); *G11C 2213/72* (2013.01); *G11C 2213/79* (2013.01); *G11C 2213/82* (2013.01); *H01L 45/1625* (2013.01)

(58) Field of Classification Search
USPC ........................................................ 365/148
See application file for complete search history.

(56) References Cited

U.S. PATENT DOCUMENTS

| | | | |
|---|---|---|---|
| 2010/0232230 A1 | 9/2010 | Ueno | |
| 2011/0110143 A1 | 5/2011 | Kanzawa et al. | |
| 2013/0329489 A1* | 12/2013 | Kim | G11C 1/1659 |
| | | | 365/158 |

* cited by examiner

| | VOLTAGE PULSE IN NORMAL OPERATION | ADDITIONAL VOLTAGE PULSE IN ADDITIONAL PROCESS |
|---|---|---|
| CONTROL BY APPLICATION VOLTAGE | DIFFERENCE IN APPLICATION VOLTAGE | |
| CONTROL BY OPERATION CURRENT | DIFFERENCE IN OPERATION CURRENT | |
| CONTROL BY APPLICATION TIME | | DIFFERENCE IN APPLICATION TIME |

FIG. 7A
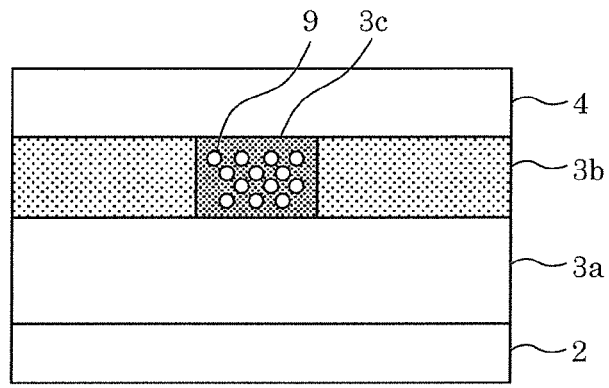
FIG. 7B
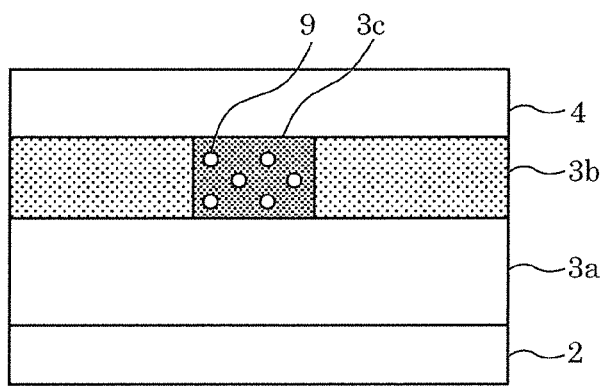
FIG. 8
| | VOLTAGE PULSE IN NORMAL OPERATION | ADDITIONAL VOLTAGE PULSE IN ADDITIONAL PROCESS |
|---|---|---|
| CASE OF CONTROL BY APPLICATION VOLTAGE | DIFFERENCE IN APPLICATION VOLTAGE | |

NON-VOLATILE STORAGE DEVICE AND DRIVING METHOD

CROSS REFERENCE TO RELATED APPLICATIONS

This application is a U.S. continuation application of PCT International Patent Application Number PCT/JP2018/024077 filed on Jun. 26, 2018, claiming the benefit of priority of Japanese Patent Application Number 2017-174642 filed on Sep. 12, 2017, the entire contents of which are hereby incorporated by reference.

BACKGROUND

1. Technical Field

The present disclosure relates to a non-volatile storage device and a method for driving a variable resistance element included in the non-volatile storage device.

2. Description of the Related Art

Variable resistance non-volatile storage devices each configured to include a variable resistance element have been conventionally known. The variable resistance element has a property of having a resistance value changes reversibly according to an electric signal and is capable of storing logic information corresponding to the resistance value in a non-volatile manner. The conventional art includes the following: U.S. Pat. No. 6,204,139, Specification; Japanese Unexamined Patent Application Publication No. 2004-363604; and a report regarding workshop on future strategy for science and technology held on Nov. 16, 2012, titled "Development of Super Long-term Memory and Systems" published as CRDS-FY2012-WR-07 by Center for Research and Development Strategy, Japan Science and Technology Agency.

SUMMARY

Non-volatile storage devices are desired to store logic information in a non-volatile manner longer than ever.

In view of this, the present disclosure has an object to provide a non-volatile storage device capable of storing logic information in a non-volatile manner longer than ever.

A non-volatile storage device according to an aspect of the present disclosure is a non-volatile storage device including: a first electrode; a second electrode; a variable resistance element which is present between the first electrode and the second electrode and includes a variable resistance layer having a resistance value which changes according to a voltage pulse that is applied between the first electrode and the second electrode; a voltage pulse application circuit which applies the voltage pulse between the first electrode and the second electrode; and a control circuit which controls the voltage pulse application circuit. The voltage pulse application circuit executes: a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information; and a resistance decreasing process for changing a resistance state of the variable resistance layer from the high resistance state to the low resistance state by applying, between the first electrode and the second electrode, a second voltage pulse having a second polarity different from the first polarity, upon receiving an external instruction, the control circuit: reads a current resistance state of the variable resistance element; and when the current resistance state read is the high resistance state, causes the voltage pulse application circuit to apply, between the first electrode and the second electrode, a first additional voltage pulse having the first polarity and energy higher than energy of the first voltage pulse; and when the current resistance state read is the low resistance state, causes the voltage pulse application circuit to apply, between the first electrode and the second electrode, a second additional voltage pulse having the second polarity and energy higher than energy of the second voltage pulse.

A driving method according to an aspect of the present disclosure is a driving method for driving a variable resistance element which includes: a first electrode; a second electrode; a variable resistance element present between the first electrode and the second electrode, the variable resistance element including a variable resistance layer having a resistance value which changes according to a voltage pulse that is applied between the first electrode and the second electrode. The driving method includes: a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information; a resistance decreasing process for changing a resistance state of the variable resistance layer from the high resistance state to the low resistance state by applying, between the first electrode and the second electrode, a second voltage pulse having a second polarity different from the first polarity; a reading process for reading a current resistance state of the variable resistance element upon receiving an external instruction; and an additional process for: applying, between the first electrode and the second electrode, a first additional voltage pulse having the first polarity and energy higher than energy of the first voltage pulse when the current resistance state read in the reading process is the high resistance state; and applying, between the first electrode and the second electrode, a second additional voltage pulse having the second polarity and energy higher than energy of the second voltage pulse when the current resistance state read in the reading process is the low resistance state.

Furthermore, a driving method according to an aspect of the present disclosure is a driving method for driving a plurality of variable resistance elements each of which includes: a first electrode; a second electrode; a variable resistance element present between the first electrode and the second electrode, the variable resistance element including a variable resistance layer having a resistance value which changes according to a voltage pulse that is applied between the first electrode and the second electrode. The driving method includes: a resistance increasing process for changing a resistance state of at least one first variable resistance element among the plurality of variable resistance elements from a low resistance state to a high resistance state in which the variable resistance layer has a higher resistance value than in the low resistance state, by applying a first voltage pulse having a first polarity between the first electrode and the second electrode in the at least one first variable resistance element, the low resistance state indicating first logic information, the high resistance state indicating second logic information different from the first logic information; a resistance increasing process for changing a resistance state of at least one second variable resistance element among the plurality of variable resistance elements from the high resistance state to the low resistance state by applying a second voltage pulse having a second polarity different from the first polarity between the first electrode and the second electrode in the at least one second variable resistance element; a reading process for reading a current resistance state of each of the plurality of variable resistance elements upon receiving an external instruction; and an additional process for: applying a first additional pulse having the first polarity and energy higher than the energy of the first voltage pulse between the first electrode and the second electrode in each of one or more first variable resistance elements whose current resistance state read in the reading process is the high resistance state among the plurality of variable resistance elements; and applying a second additional pulse having the second polarity and energy higher than the energy of the second voltage pulse between the first electrode and the second electrode in each of one or more second variable resistance elements whose current resistance state read in the reading process is the low resistance state among the plurality of variable resistance elements.

According to the present disclosure, it is possible to provide the non-volatile storage device and the driving method thereof for storing logic information in a non-volatile manner longer than ever.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 7A is a cross-sectional diagram of the variable resistance element in a low resistance state.

FIG. 7B is a cross-sectional diagram of the variable resistance element in a high resistance state.

FIG. 8 is a schematic diagram illustrating a relationship between a voltage pulse at a normal operation time and an additional voltage pulse in an additional process according to Variation 1.

DETAILED DESCRIPTION OF THE EMBODIMENTS

Figure 1:
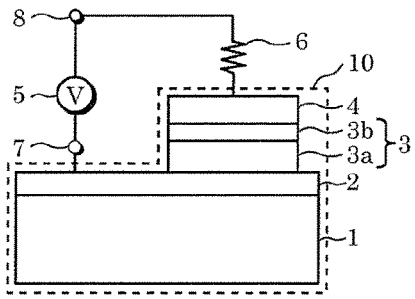
FIG. 1 is a schematic diagram illustrating an example of a configuration of a variable resistance element according to Embodiment 1.

Underlying Knowledge Forming Basis of the Present Invention

In recent years, functions of electronic devices such as mobile information devices and information home appliances have been much improved with development in digital techniques. With the improved functions of the electronic devices, semiconductor elements for use therein have become smaller and faster rapidly. In particular, applications for non-volatile memories having large capacity represented by flash memories have been extended rapidly.

Furthermore, research and development have been made for variable resistance non-volatile storage devices each including what is called a variable resistance element as a next-generation new-type non-volatile memory which replaces a flash memory. A variable resistance element is an element having a property that a resistance value thereof changes reversibly according to an electric signal and storing information corresponding to the resistance value in a non-volatile manner.

As a variable resistance element as such according to a conventional technique, a non-volatile variable resistance element made of a perovskite material (such as $Pr_{(1-x)}Ca_xMnO_3$ [PCMO], $LaSrMnO_3$[LSMO], $GdBaCo_xO_y$ [GBCO], a transition metal oxide (NiO, V2O, ZnO, Nb2O5, TiO2, WO3, or CoO), or the like has been proposed. This technique is for applying a voltage pulse (a wave-shaped voltage having a short duration) to an oxide material to increase or decrease the resistance value thereof, causing data to correspond to a variable resistance value, and storing the data.

Digital information will be increasingly wide-spread in the future. In such circumstances, techniques for achieving information on society, industry, identity of each person, culture, history, etc. to be handed down to future generations are increasingly regarded as more important, and information storage life is desired to be a hundred or more years. It is said that guarantee periods of paper products which are conventional storage media are 250 years, and that guarantee periods of microfilms are 500 years.

However, guarantee periods of non-volatile memory products including normal variable resistance non-volatile storage devices are short, specifically approximately 10 years. In view of this, an approach of "migration" is used in current storage systems for long-term storage of digital information (see the above-listed report "Development of Super Long-term Memory and Systems"). The "migration" means moving the whole data from a current storage device to a new storage device every elapse of a certain period of time.

However, migration requires enormous cost for moving data. Thus, storage systems for long-term storage of digital information without the necessity of migration are desired to be configured. For example, non-volatile storage devices having lives of 100 years or more are desired.

The inventor has studied in order to increase the storage lives of variable resistance elements, and as a result, has found that: the storage life of a variable resistance element is prolonged by performing either a final normal resistance increasing process or a final normal resistance decreasing process before the variable resistance element is stored, and then further performing at least one of (i) application of an additional voltage pulse having energy higher than the energy of a normal resistance decreasing voltage pulse applied to the variable resistance element in a low resistance state, to the variable resistance element in a low resistance state, or (ii) application of an additional voltage pulse having energy higher than the energy of a normal resistance increasing voltage pulse applied to the variable resistance element in a high resistance state, to the variable resistance element in a high resistance state. Details of the finding will be described as appropriate in the embodiments below.

A non-volatile storage device according to an aspect of the present disclosure is a non-volatile storage device including: a first electrode; a second electrode; a variable resistance element which is present between the first electrode and the second electrode and includes a variable resistance layer having a resistance value which changes according to a voltage pulse that is applied between the first electrode and the second electrode; a voltage pulse application circuit which applies the voltage pulse between the first electrode and the second electrode; and a control circuit which controls the voltage pulse application circuit. The voltage pulse application circuit executes: a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information; and a resistance decreasing process for changing a resistance state of the variable resistance layer from the high resistance state to the low resistance state by applying, between the first electrode and the second electrode, a second voltage pulse having a second polarity different from the first polarity, upon receiving an external instruction, the control circuit: reads a current resistance state of the variable resistance element; and when the current resistance state read is the high resistance state, causes the voltage pulse application circuit to apply, between the first electrode and the second electrode, a first additional voltage pulse having the first polarity and energy higher than energy of the first voltage pulse; and when the current resistance state read is the low resistance state, causes the voltage pulse application circuit to apply, between the first electrode and the second electrode, a second additional voltage pulse having the second polarity and energy higher than energy of the second voltage pulse.

In the non-volatile storage device, the control circuit may include a processor and a memory, and control the voltage pulse application circuit by causing the processor to execute a program stored in the memory.

In the non-volatile storage device, the external instruction may be a user instruction for stabilizing the current resistance state of the variable resistance layer over a period longer than a currently-set period.

A driving method according to an aspect of the present disclosure is a driving method for driving a variable resistance element which includes: a first electrode; a second electrode; a variable resistance element present between the first electrode and the second electrode, the variable resistance element including a variable resistance layer having a resistance value which changes according to a voltage pulse that is applied between the first electrode and the second electrode. The driving method includes: a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information; a resistance decreasing process for changing a resistance state of the variable resistance layer from the high resistance state to the low resistance state by applying, between the first electrode and the second electrode, a second voltage pulse having a second polarity different from the first polarity; a reading process for reading a current resistance state of the variable resistance element upon receiving an external instruction; and an additional process for: applying, between the first electrode and the second electrode, a first additional voltage pulse having the first polarity and energy higher than energy of the first voltage pulse when the current resistance state read in the reading process is the high resistance state; and applying, between the first electrode and the second electrode, a second additional voltage pulse having the second polarity and energy higher than energy of the second voltage pulse when the current resistance state read in the reading process is the low resistance state.

In the driving method, the first additional voltage pulse may be a voltage pulse which makes a current that flows through the variable resistance layer larger than a current corresponding to the first voltage pulse.

In the driving method, the second additional voltage pulse may be a voltage pulse which makes a current that flows through the variable resistance layer larger than a current corresponding to the second voltage pulse.

In the driving method, the first additional voltage pulse may be a voltage pulse which makes an absolute value of a voltage to be applied to the variable resistance layer larger than an absolute value of a voltage corresponding to the first voltage pulse.

In the driving method, the second additional voltage pulse may be a voltage pulse which makes an absolute value of a voltage to be applied to the variable resistance layer larger than an absolute value of a voltage corresponding to the second voltage pulse.

In the driving method, the first additional voltage pulse may be a voltage pulse having a pulse width larger than a pulse width of the first voltage pulse.

In the driving method, the second additional voltage pulse may be a voltage pulse having a pulse width larger than a pulse width of the second voltage pulse.

In the driving method, in the additional process, when the current resistance state read in the reading process is the high resistance state, a third additional voltage pulse having the second polarity may be applied between the first electrode and the second electrode before the first additional voltage pulse is applied.

In the driving method, the third additional voltage pulse and the second voltage pulse may have an equal voltage.

In the driving method, in the additional process, when the current resistance state read in the reading process is the low resistance state, a fourth additional voltage pulse having the first polarity may be applied between the first electrode and the second electrode before the second additional voltage pulse is applied.

In the driving method, the fourth additional voltage pulse and the first voltage pulse may have an equal voltage.

In the driving method, the additional process may be repeated twice or more.

In the driving method, the variable resistance layer may have a metal oxide layer, the metal oxide layer may include a local region having an oxygen content lower than an oxygen content of a surrounding region, and in the additional process: the oxygen content of the local region may increase when the first additional voltage pulse is applied between the first electrode and the second electrode; and the oxygen content of the local region may decrease when the second additional voltage pulse is applied between the first electrode and the second electrode.

Furthermore, a driving method according to an aspect of the present disclosure is a driving method for driving a plurality of variable resistance elements each of which includes: a first electrode; a second electrode; a variable resistance element present between the first electrode and the second electrode, the variable resistance element including a variable resistance layer having a resistance value which changes according to a voltage pulse that is applied between the first electrode and the second electrode. The driving method includes: a resistance increasing process for changing a resistance state of at least one first variable resistance element among the plurality of variable resistance elements from a low resistance state to a high resistance state in which the variable resistance layer has a higher resistance value than in the low resistance state, by applying a first voltage pulse having a first polarity between the first electrode and the second electrode in the at least one first variable resistance element, the low resistance state indicating first logic information, the high resistance state indicating second logic information different from the first logic information; a resistance increasing process for changing a resistance state of at least one second variable resistance element among the plurality of variable resistance elements from the high resistance state to the low resistance state by applying a second voltage pulse having a second polarity different from the first polarity between the first electrode and the second electrode in the at least one second variable resistance element; a reading process for reading a current resistance state of each of the plurality of variable resistance elements upon receiving an external instruction; and an additional process for: applying a first additional pulse having the first polarity and energy higher than the energy of the first voltage pulse between the first electrode and the second electrode in each of one or more first variable resistance elements whose current resistance state read in the reading process is the high resistance state among the plurality of variable resistance elements; and applying a second additional pulse having the second polarity and energy higher than the energy of the second voltage pulse between the first electrode and the second electrode in each of one or more second variable resistance elements whose current resistance state read in the reading process is the low resistance state among the plurality of variable resistance elements.

Hereinafter, specific examples according to embodiments are described with reference to the drawings. The numerical values, shapes, materials, constituent elements, the arrangement and connection of the constituent elements, steps, the processing order of the steps etc. indicated in the following exemplary embodiments are mere examples, and therefore do not limit the scope of the appended Claims and their equivalents. The present invention is limited only by the claims. Therefore, among the constituent elements in the following exemplary embodiments, constituent elements not recited in any one of the independent claims that define the most generic concept of the present invention are described as arbitrary elements which are not always required to solve the problem that can be solved according to the present disclosure but may constitute possible embodiments according to the present disclosure.

Embodiment 1

[A Configuration of a Variable Resistance Element]

First, an example of a configuration of a variable resistance element according to Embodiment 1 is described.

FIG. 1 is a schematic diagram illustrating an example of the configuration of variable resistance element 10 which is an example of the variable resistance element according to Embodiment 1.

As illustrated in FIG. 1, variable resistance element 10 includes: substrate 1; first electrode 2 formed on substrate 1; variable resistance layer 3 formed as a metal oxide layer on first electrode 2; and second electrode 4 formed on variable resistance layer 3. First electrode 2 and second electrode 4 are electrically connected to variable resistance layer 3. In other words, variable resistance element 10 includes: first electrode 2; second electrode 4; and variable resistance layer 3 present between first electrode 2 and second electrode 4.

It is to be noted that first electrode 2 may be approximately equal sized with second electrode 4, and that each of first electrode 2 and second electrode 4 and variable resistance layer 3 may be arranged upside down or horizontally.

Substrate 1 is configured as, for example, a silicon substrate on which circuit elements such as transistors are formed. First electrode 2 and second electrode 4 are configured using one or more materials selected, for example, from among gold (Au), platinum (Pt), iridium (Ir), copper (Cu), tungsten (w), and tantalum nitride (TaN).

Variable resistance layer 3 has a resistance which is variable according to a voltage pulse which is applied between first electrode 2 and second electrode 4. Variable resistance layer 3 is made of a metal oxide, and composed of first tantalum oxide layer 3a and second tantalum oxide layer 3b. Here, second tantalum oxide layer 3b has an oxygen content which is higher than the oxygen content of first tantalum oxide layer 3a.

Here, it is only necessary that $0<x<2.5$ is satisfied when the composition of first tantalum oxide layer 3a is $TaO_x$, and that $x<y$ is satisfied when the composition of second tantalum oxide layer 3b is $TaO_y$. In addition, when $0.8 \le x \le 1.9$ and $2.1 \le y \le 2.5$ are satisfied, a resistance value of variable resistance layer 3 was changed stably and fast. Accordingly, x and y may be within the above ranges.

Variable resistance layer 3 may have a thickness of 40 nm or less although a resistance value changes when the thickness is 1 μm or less. The configuration can be easily processed when photolithography and etching are performed as patterning processes, and can furthermore reduce a voltage value of a voltage pulse which is required to change a resistance value of variable resistance layer 3. In terms of avoiding breakdown (electrical breakdown) when a voltage pulse is applied more reliably, variable resistance layer 3 may have a thickness of at least 5 nm.

Second tantalum oxide layer 3b may have a thickness ranging from 1 nm to 8 nm in terms of reducing the possibility that an initial resistance value becomes too high and achieving a stable resistance variation.

When variable resistance element 10 configured as described above is operated, first electrode 2 and second electrode 4 are electrically connected to different terminals (here, first terminal 7 and second terminal 8) of power supply 5. It is to be noted that variable resistance element 10 may be electrically connected to power supply 5 via protective resistance 6. Power supply 5 is configured to apply, to variable resistance element 10, electric pulse (voltage pulse) having a predetermined polarity, voltage, and time width, so that power supply 5 functions as an electric pulse application device for driving variable resistance element 10. It is to be noted that protective resistance 6 is intended to avoid breakdown of variable resistance element 10 due to over current. In Embodiment 1, the resistance value is, for example, 4.5 kΩ. The voltage pulse is applied between first terminal 7 and second terminal 8.

Hereinafter, the voltage of the voltage pulse to be applied between the terminals is identified based on the potential of second terminal 8 predetermined with respect to first terminal 7. At this time, the polarity of the current when a positive voltage is applied to second terminal 8 is determined to be positive.

[A Method for Manufacturing a Variable Resistance Element]

Next, an example of a method for manufacturing variable resistance element 10 is described.

First, first electrode 2 having a thickness of 20 nm is formed on substrate 1 using a sputtering method. Subsequently, a tantalum oxide layer is formed on first electrode 2 using what is called a reactive sputtering method for sputtering a Ta target in argon and oxygen gases. Here, the tantalum oxide layer has an oxygen content which can be easily adjusted by changing the ratio of the flow rate of the oxygen gas with respect to the argon gas. It is to be noted that the substrate can have a room temperature without being especially heated.

Next, the quality of the surface of the tantalum oxide layer formed as described above is improved by oxidizing the uppermost surface thereof. Alternatively, a layer having a higher oxygen content is formed according to a sputtering method, using a tantalum oxide (for example, Ta2O5) target having a high oxygen content. In this way, a region (second region) is formed on the surface of the tantalum oxide layer which has been previously formed. The second region has an oxygen content higher than the oxygen content of a non-oxidized region (first region) in the tantalum oxide layer previously formed.

The first region and the second region correspond to first tantalum oxide layer 3a and second tantalum oxide layer 3b, respectively. First tantalum oxide layer 3a and second tantalum oxide layer 3b formed in this way constitute variable resistance layer 3.

Next, variable resistance element 10 is obtained by forming second electrode 4 having a thickness of 40 nm on variable resistance layer 3 formed as described above, using a sputtering method.

It is to be noted that the sizes and shapes of first electrode 2, second electrode 4, and variable resistance layer 3 can be adjusted by a photomask and photolithography. In this embodiment, the sizes of second electrode 4 and variable resistance layer 3 are designed to be 0.1 μm×0.1 μm (area 0.01 μm²), and that the size of the interface between first electrode 2 and variable resistance layer 3 is also designed to be 0.1 μm×0.1 μm (area 0.01 μm²).

In this embodiment, the composition of first tantalum oxide layer 3a is designed to be TaOx (x=1.54), and the composition of second tantalum oxide layer 3b is designed to be TaOy (y=2.47). Furthermore, variable resistance layer 3, first tantalum oxide layer 3a, and second tantalum oxide layer 3b are designed to have a thickness of 25 nm, 20 nm, and 5 nm, respectively.

Although x=1.54 and y=2.47 are satisfied in this embodiment, it is to be noted that the values of x and y are not limited thereto. For example, 0.8≤x≤1.9 and 2.1≤y≤2.5 may be satisfied. The configuration also achieves a stable resistance variation property similar to the resistance variation property obtainable according to this embodiment.

[An Operation of Variable Resistance Element 10]

Next, a description is given of an operation of variable resistance element 10 obtained according to the above-described manufacturing method.

Hereinafter, a state in which the resistance value of variable resistance layer 3 is a predetermined high value (for example, 200 kΩ or more, typically, 300 kΩ) indicating first logic information (here, for example, a logic value of 1) is referred to as a high resistance state, and a state in which the resistance value of variable resistance layer 3 is a predetermined low value (for example, 20 kΩ or less, typically, 12 kΩ) indicating second logic information (here, for example, a logic value of 0) is referred to as a low resistance state.

A resistance decreasing voltage pulse which is a negative-polarity voltage pulse applied by power supply 5 between first terminal 7 and second terminal 8 decreases the resistance value of variable resistance layer 3, which changes a resistance state of variable resistance layer 3 from a high resistance state to a low resistance state. Hereinafter, this process is referred to as a resistance decreasing process.

A resistance increasing voltage pulse which is a positive-polarity voltage pulse applied by power supply 5 between first terminal 7 and second terminal 8 increases the resistance value of variable resistance layer 3, which changes a resistance state of variable resistance layer 3 from a low resistance state to a high resistance state. Hereinafter, this process is referred to as a resistance increasing process.

Variable resistance element 10 operates by repeating the above-described resistance decreasing process and resistance increasing process.

In this embodiment, an initial process is executed before a first resistance decreasing process which is performed firstly. Here, the initial process is a process for achieving a stable resistance changing operation in the subsequent resistance decreasing processes and resistance increasing processes. Variable resistance element 10 which has been manufactured just before has a resistance of an initial resistance value higher than the resistance value in a high resistance state in a normal operation, and the resistance does not change even when a resistance decreasing voltage pulse or a resistance increasing voltage pulse in the normal operation is applied in the state in which the initial resistance value is maintained. In the initial process, two kinds of initial voltage pulses which are a first initial voltage pulse (resistance increasing break) which is a positive-polarity voltage pulse and a second initial voltage pulse (resistance decreasing break) which is a positive-polarity voltage pulse are applied between first terminal 7 and second terminal 8 in this stated order. Here, the resistance value of variable resistance layer 3 is decreased from the initial resistance value to a first resistance value when the first initial voltage pulse has been applied, and the first resistance value is further decreased to a second resistance value when the second initial voltage pulse has been applied. Subsequently, a resistance of variable resistance element 10 changes with application of either a resistance decreasing voltage pulse or a resistance increasing voltage pulse in a normal operation. In general, the initial process is performed on manufactured initial-state variable resistance element 10 to which any voltage has not yet been applied.

It is to be noted that the resistance value of variable resistance layer 3 may be decreased from the initial resistance value using only one of the first initial voltage pulse and the second initial voltage pulse.

Through the above-described initial process, a local region called filament and having an oxygen content lower than the oxygen content of the surrounding region is formed inside resistance variable layer 3. In a normal resistance changing operation after the initial process, a resistance state is changed from a high resistance state to a low resistance state when a resistance decreasing voltage pulse which is a negative-polarity voltage pulse is applied between first terminal 7 and second terminal 8, a resistance state is changed from a low resistance state to a high resistance state when a resistance increasing pulse which is a positive-polarity voltage pulse is applied between first terminal 7 and second terminal 8. It is considered that the mechanism of the resistance changing operation at this time functions when the oxygen content in the filament is decreased by the resistance decreasing voltage pulse or increased by the resistance increasing voltage pulse. Here, assuming that the oxygen contents in the filament in the high resistance state and in the low resistance state in a normal resistance changing operation are NHOx and NLOx, NHOx>NLOx is satisfied. Although the filament is formed through the initial process in this embodiment, it is to be noted that the filament does not always need to be formed through the initial process, and that a Ta oxide layer having an oxygen content lower than the oxygen content of a stoichiometry tantalum oxide may be formed when variable resistance element 10 is formed.

[An Additional Voltage Pulse Application Process]

In this embodiment, after setting the resistance states of variable resistance element 10 to a high resistance state and a low resistance state by the above-described normal resistance changing operation, a user of a non-volatile storage device including variable resistance element 10 can give the non-volatile storage device an instruction regarding future handling of information stored therein via a user interface, or the like of the non-volatile storage device. The instruction may be an instruction for causing an operation for reading the stored information without rewriting anymore, or an instruction for stabilizing the resistance state of variable resistance layer 3 over a period longer than a currently-set period (hereinafter, also referred to as an "instruction for long-term storage", a "user instruction for long-term storage", or an "external instruction"). Upon receiving the instruction, the non-volatile storage device reads information indicating whether the resistance state of variable resistance element 10 is high or low. The non-volatile storage device additionally applies, to variable resistance element 10 in a low resistance state, a voltage pulse whose polarity is the same as the polarity of a normal resistance decreasing voltage pulse and whose energy is higher than the energy of the normal resistance decreasing voltage pulse. The non-volatile storage device additionally applies, to variable resistance element 10 in a high resistance state, a voltage pulse whose polarity is the same as the polarity of a normal resistance increasing voltage pulse and whose energy is higher than the energy of the normal resistance increasing voltage pulse.

Figure 2:
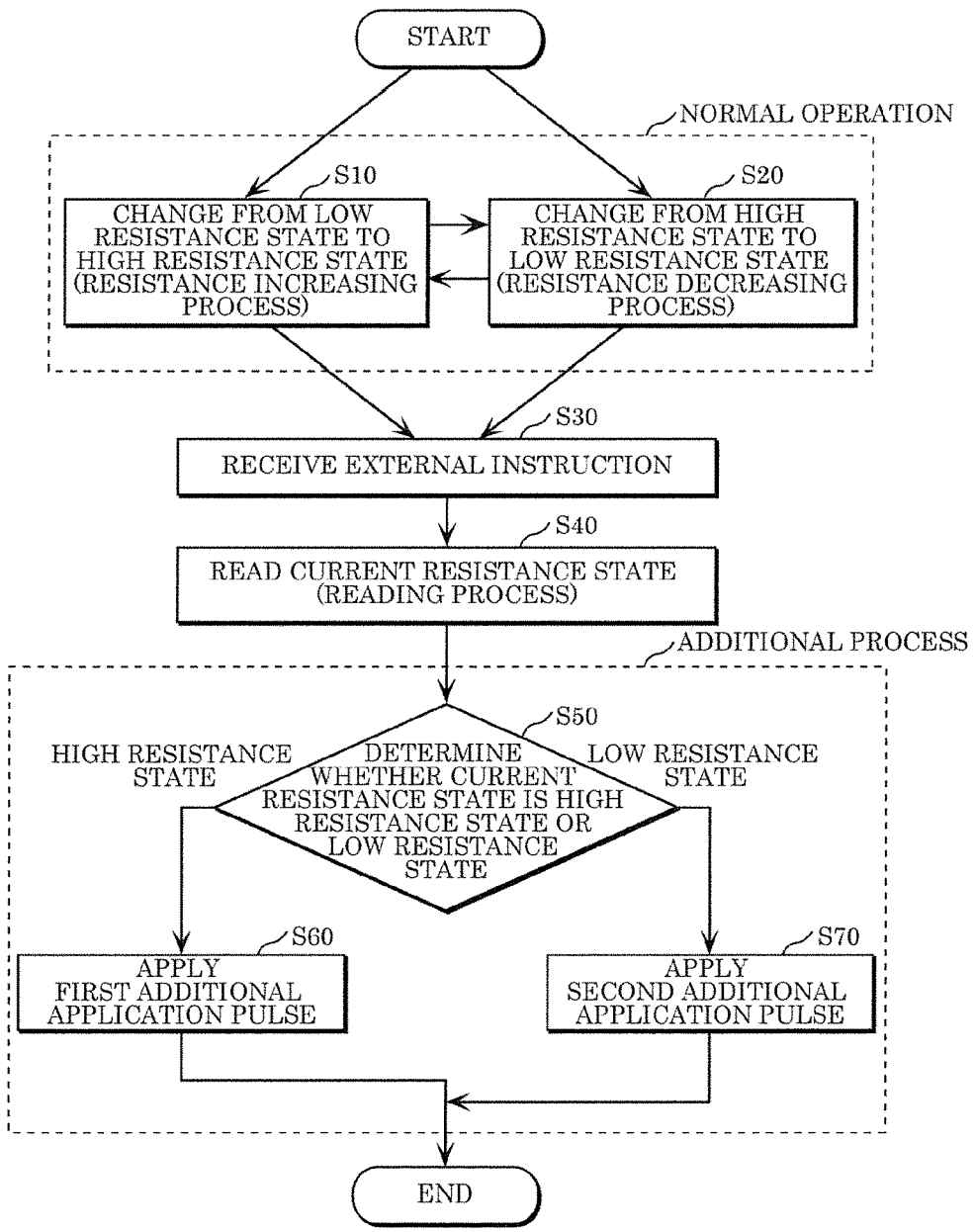
FIG. 2 is a flowchart indicating an example of a method for driving a variable resistance element according to Embodiment 1.

FIG. 2 is a flowchart indicating an example of a method for driving variable resistance element 10 according to Embodiment 1.

As illustrated in FIG. 2, the non-volatile storage device repeats, in a normal operation, (i) a resistance increasing process (Step S10) for changing a resistance state of variable resistance layer 3 from a low resistance state indicating first logic information to a high resistance state indicating second logic information by applying a first voltage pulse (a resistance increasing voltage pulse) between first electrode 2 and second electrode 4 and (ii) a resistance decreasing process (Step S20) for changing a resistance state of variable resistance layer 3 from a high resistance state to a low resistance state by applying a second voltage pulse (a resistance decreasing voltage pulse) whose polarity is different from the first polarity between first electrode 2 and second electrode 4.

Upon receiving an instruction (for example, an external instruction for instructing long-term storage) (Step S30), the non-volatile storage device performs a reading process for reading a resistance state of variable resistance element 10 (Step S40). When the current resistance state read in the reading process is a high resistance state (when the current resistance state is determined to be a high resistance state in the process in Step S50), the non-volatile storage device applies, between first electrode 2 and second electrode 4, a first additional voltage pulse having a first polarity and having energy higher than the energy of the first voltage pulse (Step S60). When the current resistance state read in the reading process is a low resistance state (when the current resistance state is determined to be a low resistance state in the process in Step S50), the non-volatile storage device applies, between first electrode 2 and second electrode 4, a second additional voltage pulse having a second polarity and having energy higher than the energy of the second voltage pulse (Step S70).

The non-volatile storage device is capable of stabilizing the resistance state of variable resistance layer 3 over a period longer than a currently-set period as described above by performing the additional process composed of the process in Step S50, the process in Step S60, and the process in Step S70.

Hereinafter, a description is given assuming that the energy of a first additional voltage pulse to be applied is sufficient to change variable resistance layer 3 from a high resistance state to a low resistance state by applying a second voltage pulse (resistance decreasing voltage pulse) after the end of the additional process. However, it is to be noted that variable resistance layer 3 can be unchanged from a high resistance state to a low resistance state even by applying a second voltage pulse (resistance decreasing voltage pulse) after the end of the additional process, depending on the energy of the first additional voltage pulse to be applied. In other words, it is also possible to fix (prohibit rewriting of) the logic information to be stored in the non-volatile storage device. Likewise, hereinafter, a description is given assuming that the energy of a second additional voltage pulse is sufficient to change variable resistance layer 3 from a low resistance state to a high resistance state by applying a first voltage pulse (resistance increasing voltage pulse) after the end of the additional process. However, it is to be noted that variable resistance layer 3 can be unchanged from a low resistance state to a high resistance state even by applying a first voltage pulse (resistance increasing voltage pulse) after the end of the additional process, depending on the energy of the second additional voltage pulse to be applied. In other words, it is also possible to fix (prohibit rewriting of) the logic information to be stored in the non-volatile storage device.

Figure 3:
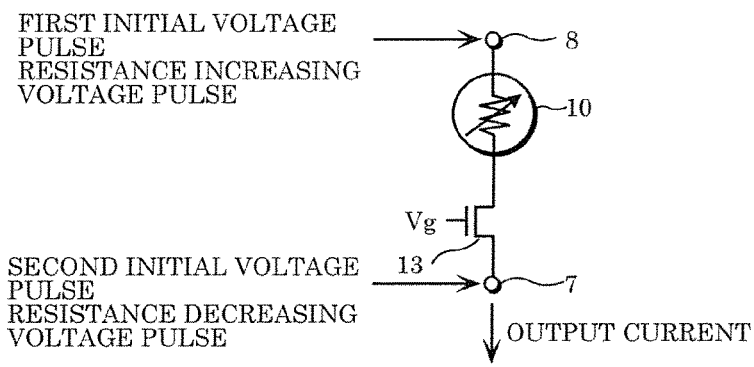
FIG. 3 is a schematic diagram illustrating an example of a configuration of a circuit which causes the variable resistance element to operate according to Embodiment 1.

FIG. 3 is a diagram illustrating an example of a configuration of a circuit for driving variable resistance element 10 according to Embodiment 1 and also indicating an operation example when data is written to variable resistance element 10. As illustrated in FIG. 3, the circuit includes variable resistance element 10, second terminal 8, and first terminal 7. Second electrode 4 and first electrode 2 of variable resistance element 10 are electrically connected to second terminal 8 and first terminal 7, respectively. In addition, transistor 13 is provided between first electrode 2 of variable resistance element 10 and first terminal 7. The transistor takes roles of a switching element for selecting variable resistance element 10 and a protective resistance. A gate voltage Vg is applied to transistor 13, so that a predetermined voltage pulse is supplied to variable resistance element 10 via transistor 13.

Figure 4A:
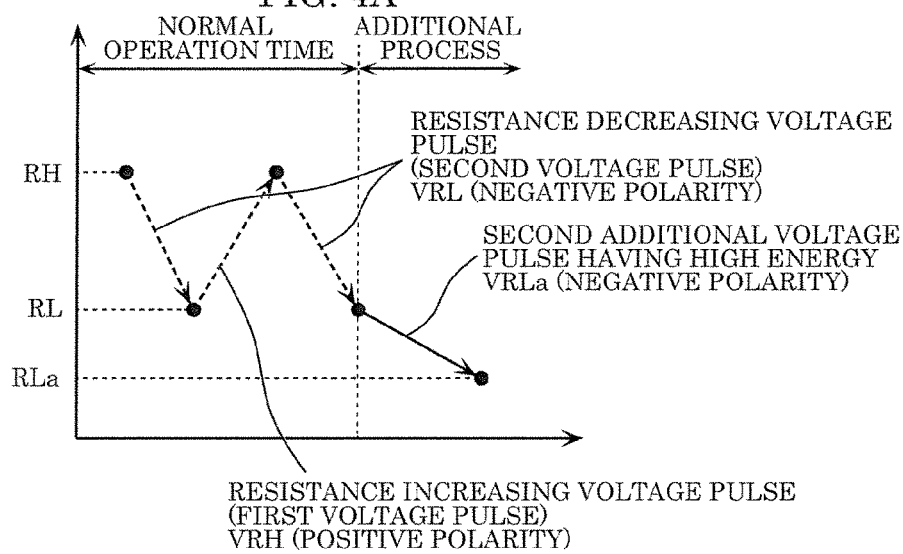
FIG. 4A is a schematic diagram illustrating variation in the resistance value of the low resistance layer according to Embodiment 1.
Figure 4B:
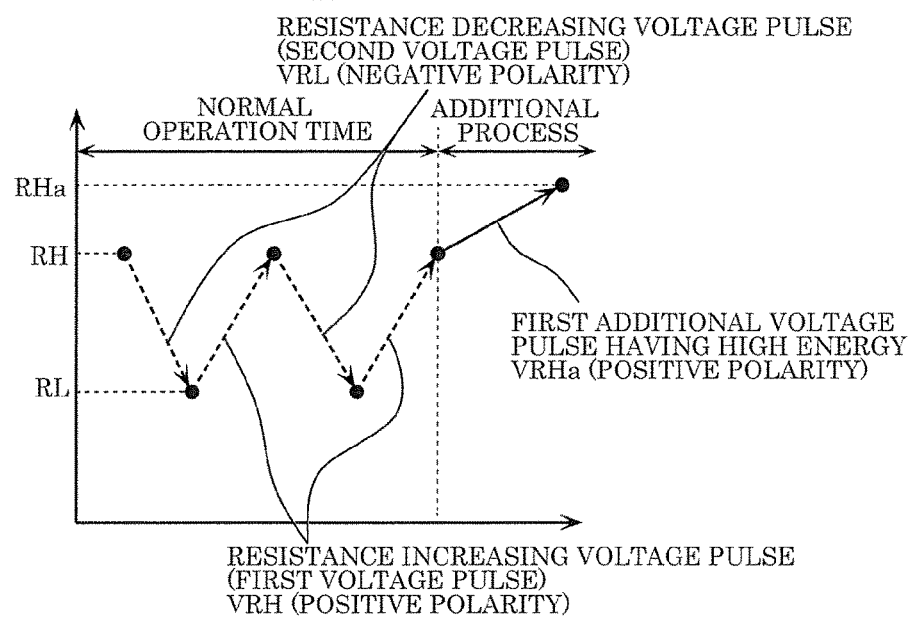
FIG. 4B is a schematic diagram illustrating variation in the resistance value of the low resistance layer according to Embodiment 1.

FIGS. 4A and 4B are each a schematic diagram illustrating a variation of resistance values of variable resistance layer 3 in (i) a resistance decreasing process for writing data that is writing a logic value of 0 to variable resistance element 10 according to Embodiment 1, (ii) a resistance increasing process for erasing data that is writing a logic value of 1 to variable resistance element 10, and (iii) an additional process. It is to be noted that in the resistance decreasing process, the resistance increasing process, and the additional process, as illustrated in FIG. 3, a positive voltage pulse having a value predetermined with respect to first terminal 7 is supplied to second terminal 8 when a positive voltage pulse is applied, and a predetermined positive voltage pulse having a value predetermined with respect to second terminal 8 is supplied to first terminal 7 when a negative voltage pulse is applied.

When variable resistance layer 3 of variable resistance element 10 is in a high resistance state in a certain point of time, supply of a negative-polarity resistance decreasing voltage pulse (second voltage pulse: voltage value VRL) to second terminal 8 changes the resistance value of variable resistance layer 3 from high resistance value RH to low resistance value RL. When the resistance value of variable resistance layer 3 is low resistance value RL, supply of a positive-polarity resistance increasing voltage pulse (first voltage pulse: voltage value VRH) to second terminal 8 changes the resistance value of variable resistance layer 3 from low resistance value RL to high resistance value RH.

Figures 5, 6:
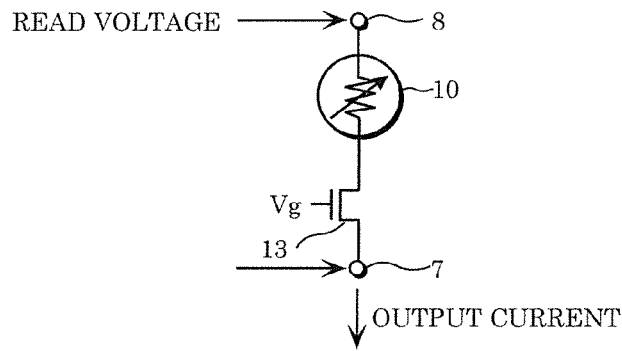
FIG. 5 is a schematic diagram illustrating an example of a configuration of a circuit which causes the variable resistance element to operate according to Embodiment 1.
FIG. 6 is a schematic diagram illustrating a relationship between a voltage pulse at a normal operation time and an additional voltage pulse in an additional process according to Embodiment 1.

FIG. 5 is a diagram illustrating an example of a configuration of a circuit for driving variable resistance element 10 according to Embodiment 1 and also indicating an operation example when data written to variable resistance element 10 is read. As illustrated in FIG. 5, a read voltage having a value predetermined with respect to first terminal 7 is supplied to second terminal 8 when the data is read. The read voltage has a value which does not change the resistance of variable resistance element 10 when the read voltage supplied, and is identified using, as references, first electrode 2 and a ground point.

As described above, upon receiving a user instruction for long-term storage, the non-volatile storage device reads a resistance state of variable resistance element 10 at the time of the reception.

The part corresponding to the additional process in FIG. 4A indicates a case where a read resistance state indicates a low resistance. In this case, a second additional voltage pulse is applied to variable resistance element 10. The second additional voltage pulse has a polarity which is the same as the polarity of the resistance decreasing voltage pulse and which has energy higher than the energy of the normal resistance decreasing voltage pulse. The second additional voltage pulse changes the resistance value of variable resistance element 10 to resistance value RLa which is lower than a resistance value which is obtainable after a normal resistance decreasing process.

The part corresponding to the additional process in FIG. 4B indicates a case where a read resistance state indicates a high resistance. In this case, a first additional voltage pulse is applied to variable resistance element 10. The first additional voltage pulse has a polarity which is the same as the polarity of the resistance increasing voltage pulse and which has energy higher than the energy of the normal resistance increasing voltage pulse. The first additional voltage pulse changes the resistance value of variable resistance element 10 to resistance value RHa which is higher than a resistance value which is obtainable after a normal resistance increasing process.

FIG. 6 is a schematic diagram indicating a relationship between (i) voltage pulses (a resistance increasing voltage pulse (a first voltage pulse) and a resistance decreasing voltage pulse (a second voltage pulse)) in a resistance increasing process and a resistance decreasing process in a normal operation of variable resistance element 10 according to Embodiment 1 and (ii) additional voltage pulses (a first additional voltage pulse and a second additional voltage pulse) in an additional process. The first additional voltage pulse has energy higher than the energy of the resistance increasing voltage pulse in the normal operation. The high energy may be achieved by designing the first additional voltage pulse to be: a voltage pulse which makes the absolute value of a voltage to be applied to variable resistance layer 3 larger than the resistance increasing voltage pulse (first voltage pulse); a voltage pulse which makes current that flows in variable resistance layer 3 when a voltage pulse is applied larger than the current corresponding to the resistance increasing voltage pulse (first voltage pulse); a voltage pulse having a pulse width greater than the pulse width of the resistance increasing voltage pulse (first voltage pulse). In addition, the relationship between the second additional voltage pulse and the resistance decreasing voltage pulse in the normal operation is similar to the above described relationship. Specifically, the high energy may be achieved by designing the second additional voltage pulse to be: a voltage pulse which makes the absolute value of a voltage to be applied to variable resistance layer 3 larger than the resistance decreasing voltage pulse (second voltage pulse); a voltage pulse which makes current that flows in variable resistance layer 3 when a voltage pulse is applied larger than the current corresponding to the resistance decreasing voltage pulse (second voltage pulse); a voltage pulse having a pulse width greater than the pulse width of the resistance decreasing voltage pulse (second voltage pulse).

[A Mechanism for Improving Data Retention Properties by Application of an Additional Voltage Pulse]

Here, a description is given of an estimated mechanism and why the mechanism improves data retention properties by application of an additional voltage pulse having energy higher than the energy obtainable in a normal operation. No final conclusion has been derived as to the mechanism for improving the data retention properties, and thus only a possibility is described.

Firstly, a description is given of the difference between a high resistance state and a low resistance state of variable resistance element 10 described in the embodiment. FIGS. 7A and 7B indicate cross-sectional schematic diagrams of variable resistance element 10 according to Embodiment 1, specifically when variable resistance element 10 is in a low resistance state and in a high resistance state, respectively.

In this embodiment, the resistance values in the low resistance state and in the high resistance state are lower than the resistance value in the initial state, and thus it is considered that local region 3c called a filament is present in second tantalum oxide layer 3b in any of the resistance states. Local region 3c has an oxygen content lower than the oxygen content of the surrounding region and which connects second electrode 4 and first tantalum oxide layer 3a. The resistance value of the variable resistance element is determined based on the number of oxygen defects 9 present in the filament. It is considered that oxygen content NLOx in the filament of variable resistance element 10 in a low resistance state and oxygen content NHOx in the filament of variable resistance element 10 in a high resistance state satisfy NLOx<NHOx.

The relationship between oxygen defects in the filament and resistance values of variable resistance element 10 is described more microscopically. In the filament, a minor conductive path of continuous oxygen defects is present. Since the number of oxygen defects is large enough in the low resistance state, the minor conductive path continues from second electrode 4 to tantalum oxide layer 3a. In contrast, the number of oxygen defects is not large enough in the high resistance state, the minor conductive path does not continue from second electrode 4 to tantalum oxide layer 3a.

Based on the resistance changing mechanism as described above, it is considered that the change from a low resistance state to a high resistance state in a storage state after a resistance change corresponds to decoupling of the continuous oxygen defects in the minor conductive path in the filament caused by means of surrounding oxygen diffusing to the minor conductive path and coupling to the oxygen defects because of the weak coupling of the oxygen defects in the minor conductive path. In view of this, it is possible to achieve storage longer than normal by additionally applying, at last, a second additional voltage pulse having energy higher than the energy in a normal operation to variable resistance element 10 in the low resistance state so as to increase the number of oxygen defects in the filament of variable resistance element 10 in a low resistance state to strengthen the coupling of oxygen defects in the minor conductive path.

Likewise, it is considered that the change from a high resistance state to a low resistance state in a storage state after a resistance change corresponds to inevitably coupling of the decoupled oxygen defects in the minor conductive path caused by means of surrounding oxygen diffusing and generating new oxygen defects, and the new oxygen defects coupling to the old oxygen defects when the number of oxygen defects is large although the minor conductive path in the filament is discontinuous. In view of this, it is possible to achieve storage longer than normal by additionally applying, at last, a first additional voltage pulse having energy higher than the energy in a normal operation to variable resistance element 10 in a high resistance state so as to decrease the number of oxygen defects in the filament of variable resistance element 10 in the high resistance state to weaken the coupling of oxygen defects in the minor conductive path.

The above description has been given taking an example in which variable resistance element 10 described in the embodiment is configured to have the variable resistance layer made of a tantalum oxide. However, it is considered that the above-described mechanism for applying additional voltage pulses is applicable to variable resistance element configured to have a variable resistance layer made of an oxide other than the tantalum oxide.

In other words, it is considered that the advantageous effect of applying additional voltage pulses described using the above-described mechanism is achieved also by a variable resistance element which is configured to have a variable resistance layer made of a metal oxide other than a tantalum oxide and changes a resistance with application of different-polarity electric pulses to electrodes therein.

It is also considered that the advantageous effect of applying additional voltage pulses is achieved also by a variable resistance element having a variable resistance the value of which is increased in a high resistance state with application of a voltage pulse having an increased energy, and is decreased in a low resistance state with application of a voltage having an increased energy, other than the variable resistance element configured to have the variable resistance layer made of the metal oxide.

According to the above-described mechanism, it is considered that the resistance value of the variable resistance element in a high resistance state can be set to higher or the resistance value of the variable resistance element in a low resistance state can be set to lower by increasing the energy of each of a resistance decreasing voltage pulse and a resistance increasing voltage pulse which is applied in a normal operation instead of applying additional voltage pulses only when a user instruction for long-term storage is received as in the present disclosure. However, in general, variable resistance elements have a problem that a variable resistance element which is in a high resistance state after repeatedly receiving a resistance decreasing voltage pulse having high energy in the past is likely to transit to a low resistance state at the time of storage, and that a variable resistance element which is in a low resistance state after repeatedly receiving a resistance increasing voltage pulse having high energy in the past is likely to transit to a high resistance state at the time of storage. For this reason, it is important to apply a high-energy pulse having the same polarity as the polarity of a resistance decreasing voltage pulse only to variable resistance element 10 in a low resistance state and apply a high-energy pulse having the same polarity as the polarity of a resistance increasing voltage pulse only to variable resistance element 10 in a high resistance state, at a timing of performing long-term storage or after final writing.

[Variation 1 of Additional Voltage Pulses]

Embodiment 1 has indicated the example in which the second additional voltage pulse having the same polarity as the polarity of the resistance decreasing voltage pulse is applied to variable resistance element 10 in the low resistance state in the additional process performed after reading on variable resistance element 10 is performed in response to the user operation for long-term storage. In this variation, in an additional process, a second additional voltage pulse having the same polarity as the polarity of a resistance decreasing voltage pulse is applied to variable resistance element 10 in a low resistance state after a voltage pulse having a polarity different from the polarity of the resistance decreasing voltage pulse is applied thereto. More specifically, a non-volatile storage device applies a fourth additional voltage pulse having a first polarity between first electrode 2 and second electrode 4 before applying a second additional voltage pulse when a resistance state read in a reading process is a low resistance state.

The fourth additional voltage pulse may be the same voltage pulse as the resistance increasing voltage pulse (first voltage pulse). In this way, it is possible to reduce oxygen content NLOx in the filament of variable resistance element 10 to be lower than oxygen content NLOx obtainable after a normal resistance decreasing process by firstly placing, by rewriting, variable resistance element 10 in a low resistance state into a high resistance state and subsequently placing variable resistance element 10 into a low resistance state using a pulse having high energy. FIG. 8 is a schematic diagram illustrating a relationship between a voltage pulse at a normal operation time and an additional voltage pulse in an additional process according to Variation 1.

In Variation 1, in an additional process, a first additional voltage pulse having the same polarity as the polarity of a resistance increasing voltage pulse is applied to variable resistance element 10 in a high resistance state after a voltage pulse having a polarity different from the polarity of the resistance increasing voltage pulse is applied thereto. More specifically, the non-volatile storage device applies a third additional voltage pulse having a second polarity between first electrode 2 and second electrode 4 before applying a first additional voltage pulse when a resistance state read in a reading process is a high resistance state.

The third additional voltage pulse may be the same voltage pulse as the resistance decreasing voltage pulse (second voltage pulse). In this way, it is possible to increase oxygen content NHOx in the filament of variable resistance element 10 more than oxygen content NHOx obtainable after a normal resistance increasing process by firstly placing, by rewriting, variable resistance element 10 in a high resistance state into a low resistance state and subsequently placing variable resistance element 10 into a high resistance state using a pulse having high energy.

[Variation 2 of Additional Voltage Pulses]

Figure 9:
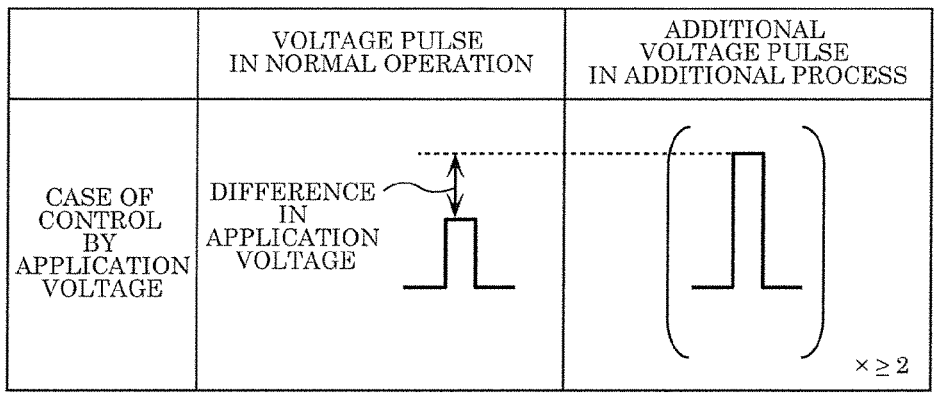
FIG. 9 is a schematic diagram illustrating a relationship between a voltage pulse at a normal operation time and an additional voltage pulse in an additional process according to Variation 2.

Embodiment 1 has indicated the example in which the second additional voltage pulse having the same polarity as the polarity of the resistance decreasing voltage pulse is applied to variable resistance element 10 in the low resistance state in the additional process performed after reading on variable resistance element 10 is performed in response to the user operation for long-term storage. In this variation, in an additional process, an additional voltage pulse having the same polarity as a resistance decreasing voltage pulse and having energy higher than the energy of the resistance decreasing voltage pulse is applied to variable resistance element 10 in a low resistance state twice or more. In this way, it is possible to reliably reduce oxygen content NLOx in the filament of variable resistance element 10 to be lower than oxygen content NLOx obtainable after a normal resistance decreasing process. FIG. 9 is a schematic diagram illustrating a relationship between a voltage pulse at a normal operation time and an additional voltage pulse in an additional process according to Variation 2.

In Variation 2, in an additional process, an additional voltage pulse having the same polarity as a resistance increasing voltage pulse and having energy higher than the energy of the resistance increasing voltage pulse is applied to variable resistance element 10 in a high resistance state twice or more. In this way, it is possible to reliably reduce oxygen content NHOx in the filament of variable resistance element 10 to be higher than oxygen content NHOx obtainable after a normal resistance increasing process.

[Variation 3 of Additional Voltage Pulses]

Figure 10:
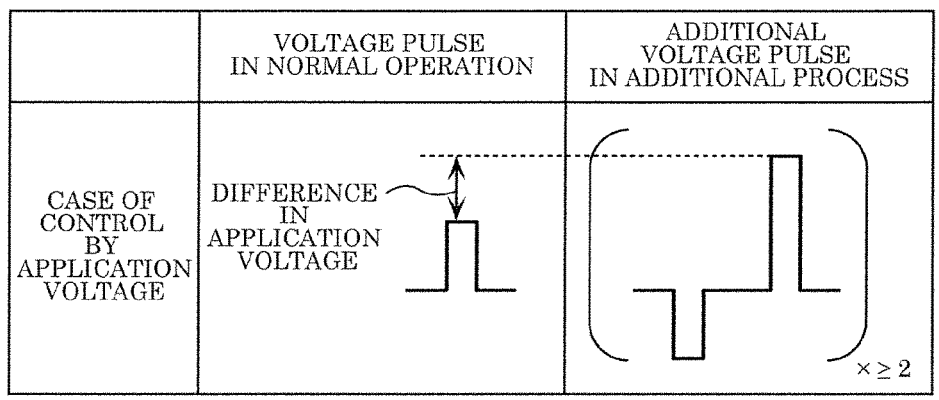
FIG. 10 is a schematic diagram illustrating a relationship between a voltage pulse at a normal operation time and an additional voltage pulse in an additional process according to Variation 3.

Variation 1 of additional voltage pulses according to Embodiment 1 has indicated the example in which, in the additional process, the second additional voltage pulse having the same polarity as the polarity of the resistance decreasing voltage pulse is applied to variable resistance element 10 in the low resistance state after the fourth additional voltage pulse having the polarity different from the polarity of the resistance decreasing voltage pulse is applied thereto. In Variation 2, in the additional process, the additional voltage pulse having the same polarity as the resistance decreasing voltage pulse and having energy higher than the resistance decreasing voltage pulse is applied to variable resistance element 10 in the low resistance state twice or more. In this variation, the following processes obtainable by combing Variation 1 and Variation 2 described above are repeated twice or more: applying an additional voltage pulse having a polarity different from the polarity of a resistance decreasing voltage pulse to variable resistance element 10 in a low resistance state; and then applying a second additional voltage pulse having the same polarity as the polarity of the resistance decreasing voltage pulse and having energy higher than the energy of the resistance decreasing voltage pulse to variable resistance element 10 in the low resistance state. In this way, it is possible to reliably reduce oxygen content NLOx in the filament of variable resistance element 10 to be lower than oxygen content NLOx obtainable after a normal resistance decreasing process. FIG. 10 is a schematic diagram illustrating a relationship between a voltage pulse at a normal operation time and an additional voltage pulse in an additional process according to Variation 3.

In Variation 3, in an additional process, the following processes are repeated twice or more: applying an additional voltage pulse having a polarity different from the polarity of a resistance increasing voltage pulse to variable resistance element 10 in a high resistance state; and then applying a first additional voltage pulse having the same polarity as the polarity of the resistance increasing voltage pulse and having energy higher than the resistance decreasing voltage pulse to variable resistance element 10 in the low resistance state. In this way, it is possible to reliably reduce oxygen content NHOx in the filament of variable resistance element 10 to be higher than oxygen content NHOx obtainable after a normal resistance increasing process.

[An Evaluation Example]

A driving method according to Variation 3 of additional voltage pulses according to Embodiment 1 was performed, and data retention properties of a group of variable resistance elements with resistance settings were evaluated.

Here, the following are specifically indicated: operation conditions in a normal operation performed in this evaluation example (operation conditions in the processes of Step S10 and Step S20 in FIG. 2); and operation conditions in an additional operation corresponding to Variation 3 of additional voltage pulse in Embodiment 1 (operation conditions in the processes of Step S60 and Step S70 in FIG. 2).

In the normal operation, a negative-polarity pulse voltage and pulse application time of 100 ns are set to a resistance decreasing voltage pulse so as to apply a current of 200 µA to variable resistance layer 3 when applying the pulse. In addition, a pulse voltage of +2.0 V to be applied to variable resistance layer 3 and pulse application time of 100 ns are set to a resistance increasing voltage pulse. In this evaluation example, a resistance changing operation in a normal operation (the processes in Steps S10 and S20 in FIG. 2) is repeated a thousand times after an initial process is performed.

In contrast, as for a group of variable resistance elements to which an additional voltage pulse has been applied, the group of variable resistance elements have been subjected to the same operation as the operation performed on a group of variable resistance elements which have been subjected to a resistance decreasing operation in a normal operation, and subsequently an additional voltage pulse is applied thereto as indicated below.

As for the second additional voltage pulse in the additional process, a pulse voltage for causing a current of 238 µA to flow in variable resistance layer 3 when the pulse voltage is applied and pulse application time of 100 ns are set. As for the first additional voltage pulse in the additional process, a pulse voltage of +2.1 V to be applied to variable resistance layer 3 and pulse application time of 100 ns are set. Although the pulse voltage for causing the current of 238 µA to flow in variable resistance layer 3 when the pulse voltage is applied has been set as the second additional voltage pulse, the current does not always need to be limited to 238 µA. When the second additional voltage pulse has the same pulse width as the pulse width of a resistance decreasing voltage pulse, it is typically desired that current which is applied to variable resistance layer 3 when the pulse is applied is within a range of 105% to 150% with respect to the current corresponding to the resistance decreasing voltage pulse. In addition, although the pulse voltage of +2.1 V is applied to variable resistance layer 3 here, the first additional voltage pulse does not always need to be limited to +2.1 V. When the first additional voltage pulse has the same pulse width as the pulse width of a resistance increasing voltage pulse, it is typically desired that current which is applied to variable resistance layer 3 is within a range of 105% to 150% with respect to the voltage of the resistance increasing voltage pulse.

It is to be noted that the following case is conceivable in which current to be applied to variable resistance layer 3 when the second additional pulse is applied is the same (that is, 200 µA) as the current corresponding to a resistance decreasing voltage pulse, and the pulse width thereof is longer than the pulse width of the resistance decreasing pulse. In this case, it is typically desired that the pulse width is within a range of 150% to 1000% with respect to the pulse width of the resistance decreasing pulse. Likewise, it is also considered that a pulse voltage which is applied to variable resistance layer 3 when the first additional voltage pulse is applied is the same (that is, +2.0 V) as the pulse voltage of a resistance increasing voltage pulse, and the pulse width thereof is longer than the pulse width of the resistance increasing pulse. In this case, it is typically desired that the pulse width is within a range of 150% to 1000% with respect to the pulse width of the resistance increasing pulse.

In addition, in the additional process, the same voltage pulse as the resistance increasing voltage pulse in a normal operation is applied as the fourth additional voltage pulse having a polarity different from the polarity of the resistance decreasing voltage pulse which is applied to variable resistance element 10 in a low resistance state. The same voltage pulse as the resistance decreasing pulse in the normal operation is applied as the third additional voltage pulse having a polarity different from the polarity of the resistance increasing voltage pulse which is applied to variable resistance element 10 in a high resistance state.

Furthermore, in the additional process, an iterative unit of application of two pulses is repeated to variable resistance element 10 in a low resistance state a hundred times: the iterative unit is composed of: application of the fourth additional voltage pulse having a polarity different from the polarity of the resistance decreasing voltage pulse; and subsequent application of the second additional voltage pulse having the same polarity as the polarity of the resistance decreasing voltage pulse. Furthermore, an iterative unit of application of two pulses is repeated to variable resistance element 10 in a high resistance state a hundred times: the iterative unit is composed of: application of the third additional voltage pulse having a polarity different from the polarity of the resistance increasing voltage pulse; and subsequent application of the first additional voltage pulse having the same polarity as the polarity of the resistance increasing voltage pulse.

In this way, the resistance value retention properties of the group of variable resistance elements prepared were evaluated. It is to be noted that variable resistance element 10 used in this evaluation example has a property that the resistance value thereof almost never deteriorates for 10 or more years. In view of this, a non-volatile storage element is held in a thermostatic bath of 210 degrees Celsius to accelerate deterioration, and retention properties thereof were evaluated. It is to be noted that the resistance values were measured at room temperature after taking out the non-volatile storage element from the thermostatic bath.

In other words, the retention properties were evaluated by repeatedly holding it in the thermostatic bath and measuring the resistance values thereof at room temperature. In addition, no further writing was performed (that is, the resistance value state which has been set as described above was maintained) on variable resistance element 10 in the evaluation of the retention properties, and only reading was performed using a voltage which is low enough to maintain the resistance.

Figure 11:
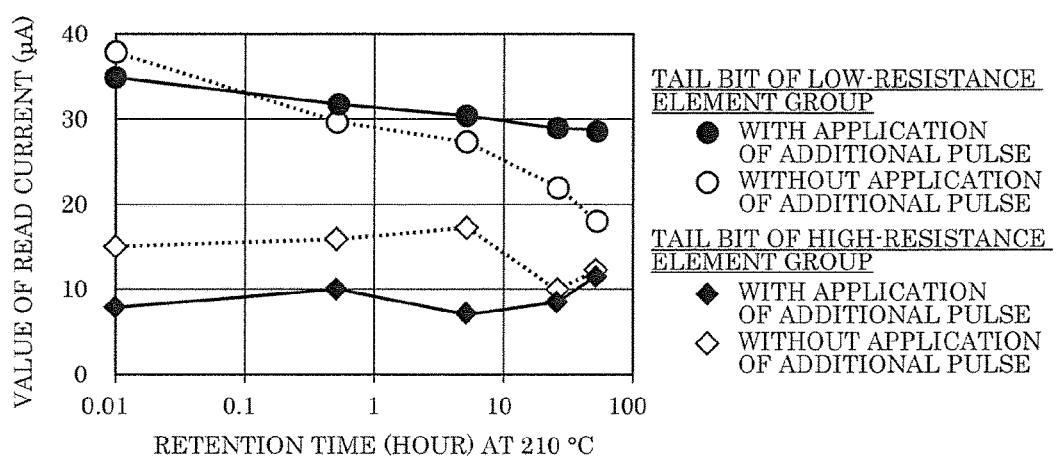
FIG. 11 is a schematic diagram illustrating evaluation results of data retention properties.

FIG. 11 shows the results of 4-kbit data retention properties of a normal group of variable resistance elements and a group of variable resistance elements 10 in a high resistance state and in a low resistance state which have been subjected to the additional process corresponding to variation 3 of Embodiment 1. In FIG. 11, the group of variable resistance elements 10 in a low resistance state is referred to as a low-resistance element group, and the group of variable resistance elements 10 in a high resistance state is referred to as a high-resistance element group. It is to be noted that FIG. 11 shows a tail bit that is an element having the worst resistance value in the group of variable resistance elements 10 in each measurement time (the tail bit means the element having the lowest read current when the elements are in a low resistance state and the element having the highest read current when the elements are in a high resistance state).

In FIG. 11, the horizontal axis denotes retention time (total) in the thermostatic bath, and the vertical axis denotes current values. The horizontal axis is plotted logarithmically, and the vertical axis is plotted linearly.

Focusing on variable resistance element 10 in a low resistance state (in which the read current value was high), decrease in the read current in the case where the element group held in the thermostatic bath was subjected to the additional process was reduced compared with the case of the element group after the normal operation. Thus, it can be said that the retention properties were improved by performing the additional process on variable resistance element 10 in the low resistance state.

Likewise, focusing on variable resistance element 10 in a high resistance state (in which the read current value was low), increase in the read current in the case where part of the element group held in the thermostatic bath was subjected to the additional process was reduced compared with the case of the element group after the normal operation. Thus, it can be said that the retention properties were improved by performing the additional process on variable resistance element 10 in the high resistance state.

In view of the above, in the driving method of the evaluation example, the retention properties of variable resistance elements 10 are increased by performing the additional process on variable resistance elements 10 in at least a low resistance state or a high resistance state; and the retention properties of variable resistance elements 10 are further increased by performing the additional process on variable resistance elements 10 in both a low resistance state and a high resistance state, and a reading error reduction effect at the time of reading after the data retention is further increased.

Embodiment 2

In Embodiment 2, a description is given of a non-volatile storage device of one transistor and one non-volatile storage type (1T1R-type) which is configured to include variable resistance element 10 described in Embodiment 1.

[A Configuration on the Non-Volatile Storage Device]

Figure 12:
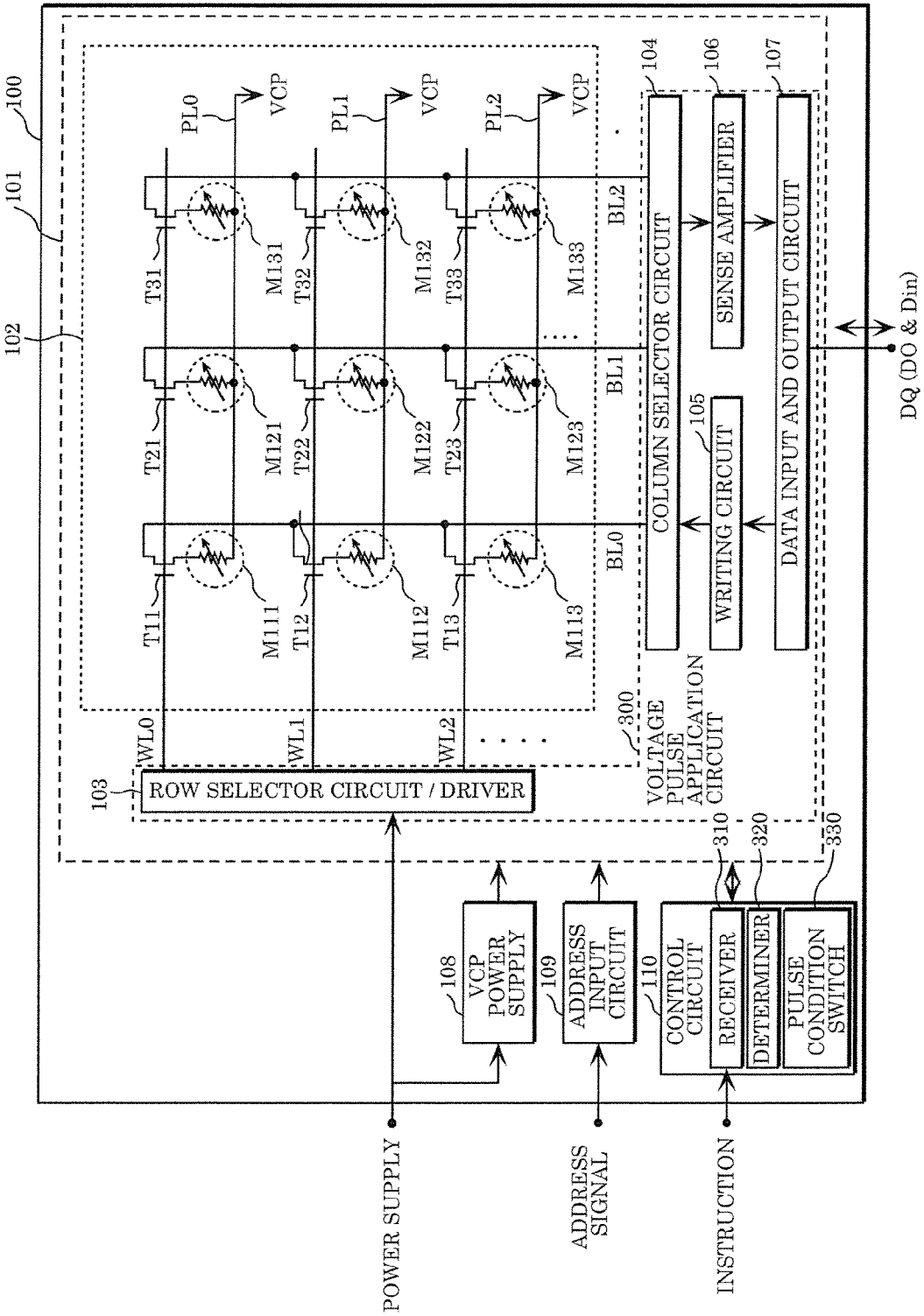
FIG. 12 is a block diagram indicating an example of a configuration of a non-volatile storage device according to Embodiment 2.

FIG. 12 is a block diagram indicating an example of a configuration of non-volatile storage device 100 according to Embodiment 2. As illustrated in FIG. 12, non-volatile storage device 100 of a 1T1R type includes memory body 101 on a semiconductor substrate. Memory body 101 includes: memory array 102 including variable resistance elements 10 arranged in an array and an access transistor (current control element); and voltage pulse application circuit 300.

Voltage pulse application circuit 300 has a function for applying a voltage pulse between first electrode 2 and second electrode 4 of each variable resistance element 10, and for example includes: row selector circuit/driver 103; column selector circuit 104; writing circuit 105 for writing information; sense amplifier 106 for detecting the amount of current that flows in a selection bit line, and determining which one of binary data is stored in each of selected variable resistance elements 10; and data input and output circuit 107 for performing a process of inputting and outputting input and output data via terminal DQ.

In addition, non-volatile storage device 100 further includes: cell plate power supply (VCP power supply) 108; address input circuit 109 for receiving an address signal to be input from outside; and control circuit 110.

Control circuit 110 is a circuit for controlling voltage pulse application circuit 300 and memory body 101, and includes: receiver 310; determiner 320; and pulse condition switch 330.

Upon receiving an external instruction (for example, a user instruction for long-term storage), receiver 310 reads a current resistance state of each variable resistance element 10 by controlling voltage pulse application circuit 300.

Determiner 320 determines whether the current resistance state read by receiver 310 is a high resistance state or a low resistance state.

Pulse condition switch 330 controls voltage pulse application circuit 300, based on the result of determination by determiner 320. More specifically, pulse condition switch 330 causes voltage pulse application circuit 300 to apply a first additional voltage pulse between first electrode 2 and second electrode 4 of variable resistance element 10 determined to be in a high resistance state. The first additional voltage pulse has a first polarity and has energy higher than the energy of a first voltage pulse. In addition, pulse condition switch 330 causes voltage pulse application circuit 300 to apply a second additional voltage pulse between first electrode 2 and second electrode 4 of variable resistance element 10 determined to be in a low resistance state. The second additional voltage pulse has a second polarity and has energy higher than the energy of a second voltage pulse.

Receiver 310, determiner 320, and pulse condition switch 330 may be configured as logic circuits, or the like, and may be implemented, for example, by means of control circuit 110 including a processor and memory having a program stored therein, and the processer executing the program.

Memory array 102 includes the following elements formed on a semiconductor substrate: a plurality of word lines WL0, WL1, WO2, . . . and a plurality of bit lines BL0, BL1, BL2, . . . arranged to intersect with each other; a plurality of access transistors T11, T12, T13, T21, T22, T23, T31, T32, T33, . . . (hereinafter denoted as "access transistors T11, T12, . . . ") provided at intersections of the plurality of word lines WL0, WL1, WO2, . . . and the plurality of bit lines BL0, BL1, BL2; and a plurality of memory cells M111, M112, M113, M121, M122, M123, M131, M132, and M133 (hereinafter denoted as "memory cells M111, M112, . . . ") provided one to one with access transistors T11, T12, . . . . Here, memory cells M111, M112, . . . correspond to variable resistance elements 10 according to Embodiment 1.

In addition, memory array 102 includes a plurality of plate lines PL0, PL1, PL2, . . . arranged to be parallel to word lines WL0, WL1, WL2, . . . .

The drains of access transistors T11, T12, and T13, the drains of access transistors T21, T22, and T23, and the drains of access transistors T31, T32, and T33 are connected to bit lines BL0, BL1, and BL2, respectively.

The gates of access transistors T11, T21, and T31, the gates of access transistors T12, T22, and T32, and the gates of access transistors T13, T23, and T33 are connected to word lines WL0, WL1, and WL2, respectively. The sources of access transistors T11, T12, . . . are connected respectively to memory cells M111, M112, . . . .

Memory cells M111, M121, M131, . . . , memory cells M112, M122, M132, . . . , and memory cells M113, M123, M133, . . . , are connected to plate line PL0, plate line PL1, and plate line PL2, respectively.

Address input circuit 109 receives an address signal from an outside circuit (not illustrated), outputs a row address signal to row selector circuit/driver 103 based on the address signal, and outputs a column address signal to column selector circuit 104. Here, the address signal is a signal indicating the address of a particular memory cell which is selected from among the plurality of memory cells M111, M112, . . . . In addition, the row address signal is a signal indicating the address of a row in the address indicated by the address signal, and the column address signal is a signal indicating the address of a column in the address indicated by the address signal.

Row selector circuit/driver 103 receives the row address signal output from address input circuit 109, selects one of the plurality of word lines WL0, WL1, WL2, . . . according to the row address signal, and applies a predetermined voltage to the selected word line.

Column selector circuit 104 receives the row address signal output from address input circuit 109, selects one of the plurality of bit lines BL0, BL1, BL2, . . . according to the column address signal, and applies each of various kinds of voltage pulses to the selected bit line.

When writing circuit 105 received a write signal output from control circuit 110, writing circuit 105 outputs a signal for instructing column selector circuit 104 to apply the voltage pulse according to the write signal to the selected bit line.

Sense amplifier 106 detects the amount of current that flows in the selected bit line which is a reading target and determines the stored data in the information reading process. In this embodiment, the resistance states of memory cells M111, M112, . . . are assumed to be two high and low states, and each of the states is associated with corresponding data. For this reason, sense amplifier 106 determines which one of the states is the resistance state of the variable resistance layer of the selected memory cell, and determines which one of binary data is stored therein according to the determined resistance state. Output data D0 obtained as a result is output to the circuit outside via data input and output circuit 107.

[An Operation in an Initial Process]

In an initial process, control circuit 110 outputs, to writing circuit 105, a write signal for instructing application of a first initial voltage pulse and a second initial voltage pulse to each of memory cells M111, M112, . . . in this stated order. When writing circuit 105 received a write signal, writing circuit 105 outputs, to column selector circuit 104, a signal for instructing application of a first initial voltage pulse and a second initial voltage pulse to each of bit lines BL0, BL1, BL2, . . . .

When column selector circuit 104 received the signal, column selector circuit 104 applies the first initial voltage pulse and the second initial voltage pulse to all of bit lines BL0, BL1, BL2, . . . . At this time, row selector circuit/driver 103 applies a predetermined voltage to all of word lines WL0, WL1, WL2, . . . .

[An Operation in a Normal Operation]

In a data writing process in a normal operation, control circuit 110 outputs, to writing circuit 105, a write signal for instructing application of either a resistance decreasing voltage pulse or a resistance increasing voltage pulse according to input data Din input in data input and output circuit 107. Meanwhile, in a data reading process, control circuit 110 outputs a read signal for instructing application of a voltage pulse for reading to column selector circuit 104.

[An Operation in an Additional Process]

When receiver 310 received a predetermined instruction from outside (for example, a user instruction for long-term storage), receiver 310 outputs a signal for instructing reading of the resistance states of all the memory cells included in memory array 102 to voltage pulse application circuit 300, thereby reading the resistance states of all the memory cells.

Determiner 320 determines, for each memory cell, whether the current resistance state read by receiver 310 is a high resistance state or a low resistance state.

Pulse condition switch 330 outputs, to voltage pulse application circuit 300, a signal for instructing each memory cell determined to be in a low resistance state to apply a first additional voltage pulse and instructing each memory cell determined to be in a high resistance state to apply a second additional voltage pulse.

Upon receiving the signal, voltage pulse application circuit 300 applies the first additional voltage pulse to each memory determined to be in the high resistance state, and applies the second additional voltage pulse to each memory determined to be in the low resistance state.

Non-volatile storage device 100 is capable of storing logic information in a period longer than conventional by operating as described above.

Embodiment 3

In Embodiment 3, a description is given of a non-volatile storage device of a cross point type which is configured to include variable resistance element 10 described in Embodiment 1.

[A Configuration on the Non-Volatile Storage Device]

Figure 13:
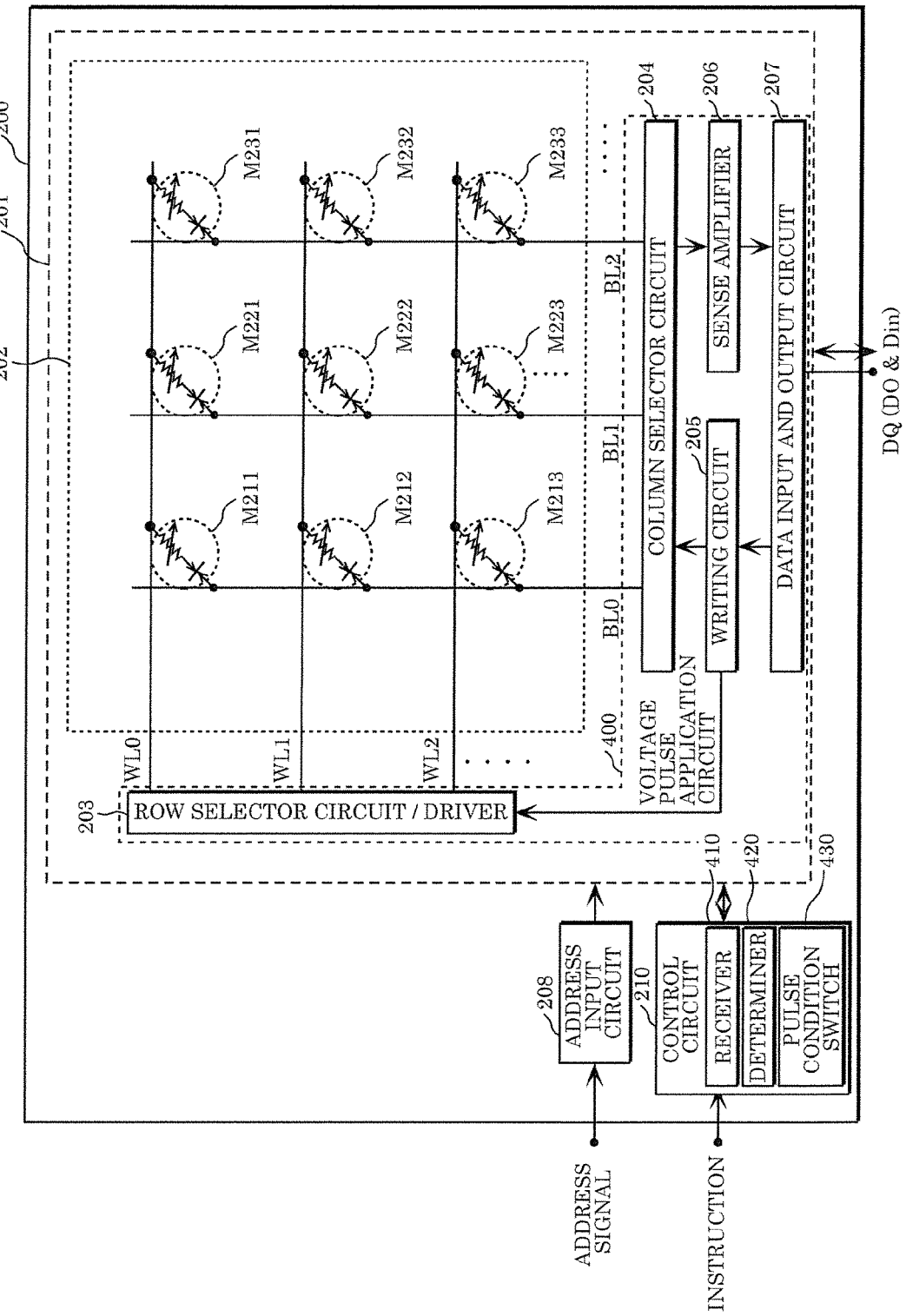
FIG. 13 is a block diagram indicating an example of a configuration of a non-volatile storage device according to Embodiment 3.

FIG. 13 is a block diagram indicating an example of a configuration of non-volatile storage device 200 according to Embodiment 3. As illustrated in FIG. 13, non-volatile storage device 200 of the cross point type includes memory body 201 on a semiconductor substrate, and memory body 201 includes: variable resistance elements 10 and a current control element arranged in an array; and voltage pulse application circuit 400.

Voltage pulse application circuit 400 has a function for applying a voltage pulse between first electrode 2 and second electrode 4 of each variable resistance element 10, and for example includes: row selector circuit/driver 203; column selector circuit/driver 204; writing circuit 205 for writing information; sense amplifier 206 for detecting the amount of current that flows in a selection bit line, and determining which one of binary data is stored in selected variable resistance elements 10; and data input and output circuit 207 for performing a process of inputting and outputting input and output data via terminal DQ.

In addition, non-volatile storage device 200 further includes: address input circuit 208 for receiving an address signal to be input from outside; and control circuit 210.

Control circuit 210 is a circuit for controlling voltage pulse application circuit 400 and memory body 201, and includes: receiver 410; determiner 420; and pulse condition switch 430.

Upon receiving an external instruction (for example, a user instruction for long-term storage), receiver 410 controls voltage pulse application circuit 400 to read a current resistance state of each variable resistance element 10.

Determiner 420 determines whether the current resistance state read by receiver 410 is a high resistance state or a low resistance state.

Pulse condition switch 430 controls voltage pulse application circuit 400, based on the result of determination by determiner 420. More specifically, pulse condition switch 430 causes voltage pulse application circuit 400 to apply a first additional voltage pulse between first electrode 2 and second electrode 4 of variable resistance element 10 determined to be in a high resistance state. The first additional voltage pulse has a first polarity and has energy higher than the energy of a first voltage pulse. In addition, pulse condition switch 430 causes voltage pulse application circuit 400 to apply a second additional voltage pulse between first electrode 2 and second electrode 4 of variable resistance element 10 determined to be in a low resistance state. The second additional voltage pulse has a second polarity and has energy higher than the energy of a second voltage pulse.

Receiver 410, determiner 420, and pulse condition switch 430 may be configured as logic circuits, or the like, and may be implemented, for example, by means of control circuit 210 including a processor and memory having a program stored therein, and the processer executing the program.

Memory array 202 includes: a plurality of word lines WL0, WL1, WL2, . . . which are formed to be parallel to each other on a semiconductor substrate; and a plurality of bit lines BL0, BL1, BL2, . . . which are formed to be parallel to each other in a plane parallel to the principal surface of the semiconductor substrate and cross the plurality of word lines WL0, WL1, WL2, . . . , three-dimensionally.

A plurality of memory cells M211, M212, M213, M221, M222, M223, M231, M232, M123, . . . (hereinafter referred to as "memory cells M211, M212, . . . ") are provided in a matrix in which the plurality of memory cells M211, M212, . . . are provided at the cross points of the plurality of word lines WL0, WL1, WL2, . . . and the plurality of bit lines BL0, BL1, BL2, . . . . Here, memory cells M211, M212, . . . are each configured by connecting an element corresponding to variable resistance element 10 according to Embodiment 1 and a current control element which is one of a metal-insulate-metal (MIM) diode and a metal-semiconductor-metal (MSM) diode, etc.

Address input circuit 208 receives an address signal from an outside circuit (not illustrated), outputs a row address signal to row selector circuit/driver 203 based on the address signal, and outputs a column address signal to column selector circuit/driver 204. Here, the address signal is a signal indicating the address of a particular memory cell which is selected from among the plurality of memory cells M211, M212, . . . . In addition, the row address signal is a signal indicating the address of a row in the address indicated by the address signal, and the column address signal is a signal indicating the address of a column in the address indicated by the address signal.

Row selector circuit/driver 203 receives the row address signal output from address input circuit 208, selects one of the plurality of word lines WL0, WL1, WL2, . . . according to the row address signal, and applies a predetermined voltage to the selected word line.

Column selector circuit/driver 204 receives the row address signal output from address input circuit 208, selects one of the plurality of bit lines BL0, BL1, BL2, . . . according to the column address signal, and applies each of various kinds of voltage pulses to the selected bit line.

When writing circuit 205 received a write signal output from control circuit 210, writing circuit 205 outputs a signal for instructing row selector circuit/driver 203 to apply a voltage to the selected word line, and outputs a signal for instructing column selector circuit/driver 204 to apply the voltage pulse according to the write signal to the selected bit line.

Sense amplifier 206 detects the amount of current that flows in the selected bit line which is a reading target and determines the stored data in the information reading process. In this embodiment, the resistance states of memory cells M211, M212, . . . are assumed to be two high and low states, and each of the states is associated with corresponding data. For this reason, sense amplifier 206 determines which one of the states is the resistance state of the variable resistance layer of the selected memory cell, and determines which one of binary data is stored therein according to the determined resistance state. Output data DO obtained as a result is output to the circuit outside via data input and output circuit 207.

[An Operation in the Initial Process]

In an initial process, control circuit 210 outputs, to writing circuit 205, a write signal for instructing application of a first initial voltage pulse and a second initial voltage pulse to each of memory cells M211, M212, . . . in this stated order. When writing circuit 105 received a write signal, writing circuit 105 outputs, to row selector circuit/driver 203, a signal for instructing application of a predetermined voltage to each of word lines WL0, WL1, WL2, . . . and outputs, to a column selector circuit/driver 204, a signal for instructing application of a first initial voltage pulse and a second initial voltage pulse to each of bit lines BL0, BL1, BL2, . . . .

[An Operation in a Normal Operation]

In a data writing process in a normal operation, control circuit 210 outputs, to writing circuit 205, a write signal for instructing application of either a resistance decreasing voltage pulse or a resistance increasing voltage pulse according to input data Din input in data input and output circuit 207. Meanwhile, in a data reading process, control circuit 210 outputs a read signal for instructing application of a voltage pulse for reading to column selector circuit/driver 204.

[An Operation in an Additional Process]

When receiver 410 received a predetermined external instruction (for example, a user instruction for long-term storage), receiver 410 outputs a signal for instructing reading of the resistance states of all the memory cells included in memory array 202 to voltage pulse application circuit 400, thereby reading the resistance states of all the memory cells.

Determiner 420 determines, for each memory cell, whether the current resistance state read by receiver 410 is a high resistance state or a low resistance state.

Pulse condition switch 430 outputs, to voltage pulse application circuit 400, a signal for instructing each memory cell determined to be in a high resistance state to apply a first additional voltage pulse and instructing each memory cell determined to be in a low resistance state to apply a second additional voltage pulse.

Upon receiving the signal, voltage pulse application circuit 400 applies the first additional voltage pulse to each memory cell determined to be in the high resistance state, and applies the second additional voltage pulse to each memory cell determined to be in the low resistance state.

Non-volatile storage device 200 is capable of storing logic information in a period longer than conventional by operating as described above.

It is to be noted that a non-volatile storage device having a multi-layered structure can be implemented by three-dimensionally stacking memory arrays 202 in non-volatile storage device 200 according to this embodiment illustrated in FIG. 13. It is possible to implement the non-volatile storage device having a super large capacity by providing the multi-layered memory arrays configured as described above.

Other Embodiments

Embodiment 2 has illustrated an example of a configuration in which non-volatile storage device 100 according to Embodiment 2 solely performs the operations in the additional process. Other conceivable examples include an example of a configuration in which a plurality of devices or circuits perform operations in additional process together.

Figure 14:
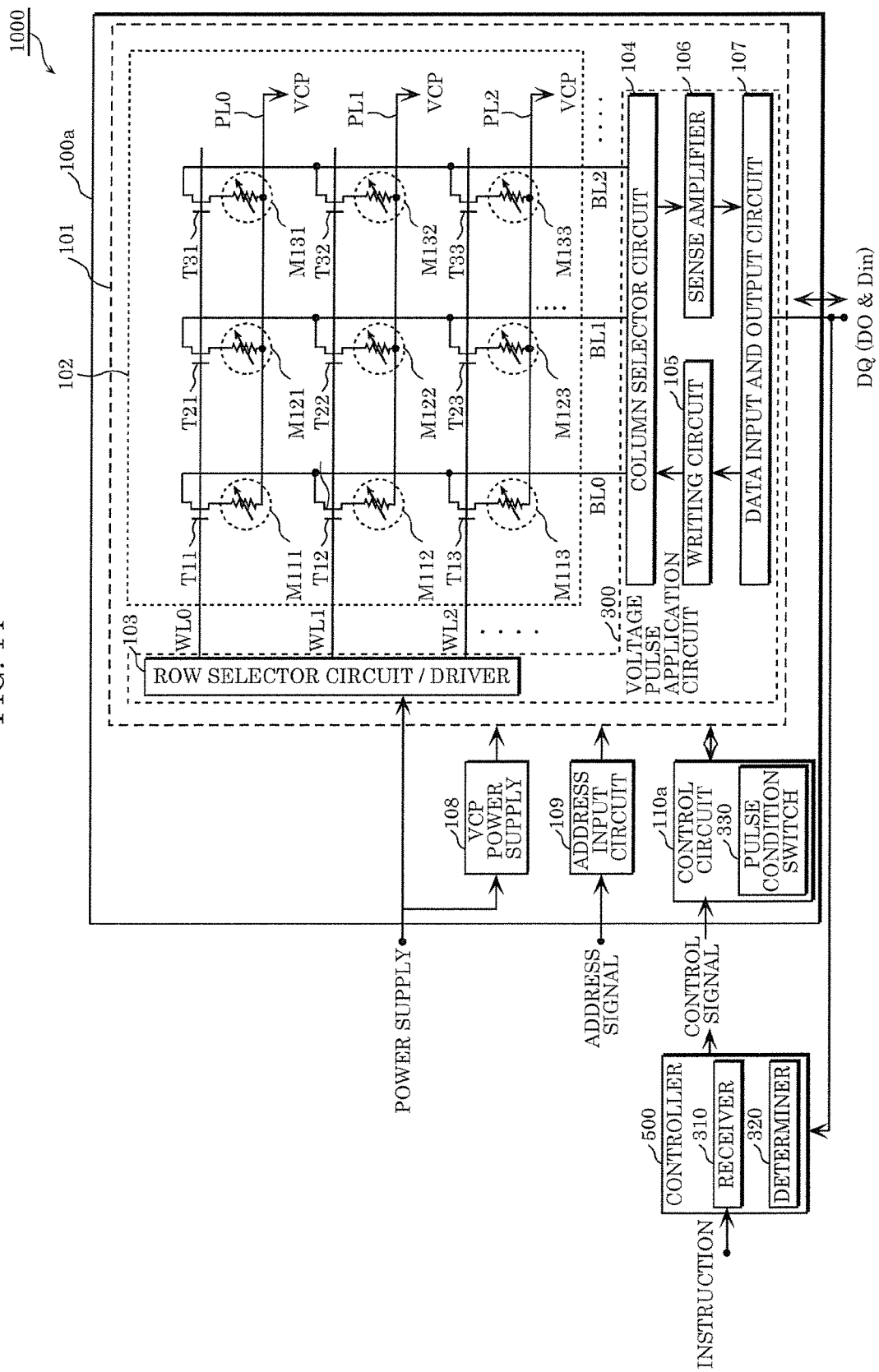
FIG. 14 is a block diagram indicating an example of a configuration of a non-volatile storage system according to another embodiment.

FIG. 14 is a block diagram indicating an example of a configuration of non-volatile storage system 1000 according to another embodiment. As illustrated in FIG. 14, non-volatile storage system 1000 is configured to include non-volatile storage device 100a and controller 500. Non-volatile storage device 100a and controller 500 execute the operations in the additional process together.

Non-volatile storage device 100a is configured by replacing control circuit 110 in non-volatile storage device 100 according to Embodiment 2 with control circuit 110a.

Control circuit 110a is configured by removing receiver 310 and determiner 320 from control circuit 110 according to Embodiment 2. Controller 500 is configured to include a processor and a memory. Receiver 310 and determiner 320 according to Embodiment 2 is functionally implemented by means of the processor executing a program stored in the memory.

Other conceivable configuration examples of controller 500 include, for example, a configuration example in which receiver 310 and determiner 320 are implemented as logic circuits.

For example, controller 500 may be implemented as a plurality of integrated circuits, or as a single integrated circuit.

In non-volatile storage system 1000 having the above-described configuration, receiver 310 and determiner 320 included in controller 500 and pulse condition switch 330 included in non-volatile storage device 100a perform together operations similar to the operations in the additional process according to Embodiment 2.

In this way, non-volatile storage system 1000 is capable of performing the operations similar to the operations in the additional process according to Embodiment 2.

Non-volatile storage system 1000 can be considered as a single device composed of non-volatile storage device 100a and controller 500. For this reason, non-volatile storage system 1000 can be referred to as a non-volatile storage device.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely applicable to variable resistance non-volatile storage devices.

What is claimed is:

1. A non-volatile storage device, comprising:
a first electrode;
a second electrode;
a variable resistance element present between the first electrode and the second electrode, the variable resistance element including a variable resistance layer having a resistance value which changes according to a voltage pulse that is applied between the first electrode and the second electrode;
a voltage pulse application circuit which applies the voltage pulse between the first electrode and the second electrode; and
a control circuit which controls the voltage pulse application circuit,
wherein the voltage pulse application circuit executes:
a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information; and
a resistance decreasing process for changing a resistance state of the variable resistance layer from the high resistance state to the low resistance state by applying, between the first electrode and the second electrode, a second voltage pulse having a second polarity different from the first polarity,
upon receiving an external instruction, the control circuit:
reads a current resistance state of the variable resistance element; and
when the current resistance state read is the high resistance state, causes the voltage pulse application circuit to apply, between the first electrode and the second electrode, a first additional voltage pulse having the first polarity and energy higher than energy of the first voltage pulse; and
when the current resistance state read is the low resistance state, causes the voltage pulse application circuit to apply, between the first electrode and the second electrode, a second additional voltage pulse having the second polarity and energy higher than energy of the second voltage pulse.

2. The non-volatile storage device according to claim 1, wherein the control circuit includes a processor and a memory, and controls the voltage pulse application circuit by causing the processor to execute a program stored in the memory.

3. The non-volatile storage device according to claim 1, wherein the external instruction is a user instruction for stabilizing the current resistance state of the variable resistance layer over a period longer than a currently-set period.

4. A driving method for driving a variable resistance element which includes: a first electrode; a second electrode; a variable resistance element present between the first electrode and the second electrode, the variable resistance element including a variable resistance layer having a resistance value which changes according to a voltage pulse that is applied between the first electrode and the second electrode, the driving method comprising:
a resistance increasing process for changing a resistance state of the variable resistance layer from a low resistance state to a high resistance state in which the variable resistance layer has a higher resistance value than in the low resistance state, by applying a first voltage pulse having a first polarity between the first electrode and the second electrode, the low resistance state indicating first logic information, the high resistance state indicating second logic information different from the first logic information;
a resistance decreasing process for changing a resistance state of the variable resistance layer from the high resistance state to the low resistance state by applying, between the first electrode and the second electrode, a second voltage pulse having a second polarity different from the first polarity;
a reading process for reading a current resistance state of the variable resistance element upon receiving an external instruction; and
an additional process for:
applying, between the first electrode and the second electrode, a first additional voltage pulse having the first polarity and energy higher than energy of the first voltage pulse when the current resistance state read in the reading process is the high resistance state; and applying, between the first electrode and the second electrode, a second additional voltage pulse having the second polarity and energy higher than energy of the second voltage pulse when the current resistance state read in the reading process is the low resistance state.

5. The driving method according to claim 4,
wherein the first additional voltage pulse is a voltage pulse which makes a current that flows through the variable resistance layer larger than a current corresponding to the first voltage pulse.

6. The driving method according to claim 4,
wherein the second additional voltage pulse is a voltage pulse which makes a current that flows through the variable resistance layer larger than a current corresponding to the second voltage pulse.

7. The driving method according to claim 4,
wherein the first additional voltage pulse is a voltage pulse which makes an absolute value of a voltage to be applied to the variable resistance layer larger than an absolute value of a voltage corresponding to the first voltage pulse.

8. The driving method according to claim 4,
wherein the second additional voltage pulse is a voltage pulse which makes an absolute value of a voltage to be applied to the variable resistance layer larger than an absolute value of a voltage corresponding to the second voltage pulse.

9. The driving method according to claim 4,
wherein the first additional voltage pulse is a voltage pulse having a pulse width larger than a pulse width of the first voltage pulse.

10. The driving method according to claim 4,
wherein the second additional voltage pulse is a voltage pulse having a pulse width larger than a pulse width of the second voltage pulse.

11. The driving method according to claim 4,
wherein, in the additional process, when the current resistance state read in the reading process is the high resistance state, a third additional voltage pulse having the second polarity is applied between the first electrode and the second electrode before the first additional voltage pulse is applied.

12. The driving method according to claim 11,
wherein the third additional voltage pulse and the second voltage pulse have an equal voltage.

13. The driving method according to claim 4,
wherein, in the additional process, when the current resistance state read in the reading process is the low resistance state, a fourth additional voltage pulse having the first polarity is applied between the first electrode and the second electrode before the second additional voltage pulse is applied.

14. The driving method according to claim 13,
wherein the fourth additional voltage pulse and the first voltage pulse have an equal voltage.

15. The driving method according to claim 4,
wherein the additional process is repeated twice or more.

16. The driving method according to claim 4,
wherein the variable resistance layer has a metal oxide layer,
the metal oxide layer includes a local region having an oxygen content lower than an oxygen content of a surrounding region, and
in the additional process:
the oxygen content of the local region increases when the first additional voltage pulse is applied between the first electrode and the second electrode; and
the oxygen content of the local region decreases when the second additional voltage pulse is applied between the first electrode and the second electrode.

17. A driving method for driving a plurality of variable resistance elements each of which includes: a first electrode; a second electrode; a variable resistance element present between the first electrode and the second electrode, the variable resistance element including a variable resistance layer having a resistance value which changes according to a voltage pulse that is applied between the first electrode and the second electrode, the driving method comprising,
a resistance increasing process for changing a resistance state of at least one first variable resistance element among the plurality of variable resistance elements from a low resistance state to a high resistance state in which the variable resistance layer has a higher resistance value than in the low resistance state, by applying a first voltage pulse having a first polarity between the first electrode and the second electrode in the at least one first variable resistance element, the low resistance state indicating first logic information, the high resistance state indicating second logic information different from the first logic information;
a resistance increasing process for changing a resistance state of at least one second variable resistance element among the plurality of variable resistance elements from the high resistance state to the low resistance state by applying a second voltage pulse having a second polarity different from the first polarity between the first electrode and the second electrode in the at least one second variable resistance element;
a reading process for reading a current resistance state of each of the plurality of variable resistance elements upon receiving an external instruction; and
an additional process for:
applying a first additional pulse having the first polarity and energy higher than the energy of the first voltage pulse between the first electrode and the second electrode in each of one or more first variable resistance elements whose current resistance state read in the reading process is the high resistance state among the plurality of variable resistance elements; and
applying a second additional pulse having the second polarity and energy higher than the energy of the second voltage pulse between the first electrode and the second electrode in each of one or more second variable resistance elements whose current resistance state read in the reading process is the low resistance state among the plurality of variable resistance elements.

* * * * *